(12) United States Patent
Mochizuki

(10) Patent No.: US 12,081,891 B2
(45) Date of Patent: Sep. 3, 2024

(54) SOLID STATE IMAGING ELEMENT AND IMAGING DEVICE TO REDUCE CIRCUIT AREA OF A PIXEL

(71) Applicant: SONY SEMICONDUCTOR SOLUTIONS CORPORATION, Kanagawa (JP)

(72) Inventor: Futa Mochizuki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 61 days.

(21) Appl. No.: 17/786,046

(22) PCT Filed: Dec. 14, 2020

(86) PCT No.: PCT/JP2020/046464
§ 371 (c)(1),
(2) Date: Jun. 16, 2022

(87) PCT Pub. No.: WO2021/131831
PCT Pub. Date: Jul. 1, 2021

(65) Prior Publication Data
US 2023/0016407 A1 Jan. 19, 2023

(30) Foreign Application Priority Data

Dec. 25, 2019 (JP) .................................. 2019-234168

(51) Int. Cl.
*H04N 25/778* (2023.01)
*H01L 27/146* (2006.01)
*H04N 25/766* (2023.01)

(52) U.S. Cl.
CPC ..... *H04N 25/778* (2023.01); *H01L 27/14612* (2013.01); *H04N 25/766* (2023.01)

(58) Field of Classification Search
CPC .... H04N 25/778; H04N 25/766; H04N 25/47; H04N 27/14612
See application file for complete search history.

(56) References Cited

U.S. PATENT DOCUMENTS

| 2017/0059399 | A1 | 3/2017 | Suh et al. |
| 2018/0191972 | A1* | 7/2018 | Berner .................. H04N 25/77 |
| 2020/0128205 | A1 | 4/2020 | Sakakibara et al. |

FOREIGN PATENT DOCUMENTS

| EP | 3576404 A1 | 12/2019 |
| JP | 2017-050853 A | 3/2017 |

(Continued)

OTHER PUBLICATIONS

International Search Report and Written Opinion of PCT Application No. PCT/JP2020/046464, issued on Jan. 19, 2021, 09 pages of ISRWO.

(Continued)

*Primary Examiner* — Nicholas G Giles
(74) *Attorney, Agent, or Firm* — CHIP LAW GROUP

(57) ABSTRACT

In a solid state imaging element in which whether or not an address event has occurred is detected, the circuit area in each pixel is reduced.
A driving circuit supplies a prescribed reference signal the level of which gradually fluctuates with lapse of time. A plurality of pixels each includes an auto-zero transistor and a reset control section. The auto-zero transistor initializes a change amount acquisition section for obtaining a brightness change amount. The reset control section switches the auto-zero transistor by using the reference signal in a case where a prescribed address event has occurred.

10 Claims, 21 Drawing Sheets

(56) References Cited

FOREIGN PATENT DOCUMENTS

| | | |
|---|---|---|
| JP | 2018-186478 A | 11/2018 |
| WO | 2019/087472 A1 | 5/2019 |

OTHER PUBLICATIONS

Lichtsteiner, et al., "A 128×128 120 dB 15 µs Latency Asynchronous Temporal Contrast Vision Sensor", IEEE Journal of Solid-State Circuits, vol. 43, No. 2, Feb. 2008, pp. 566-576.

* cited by examiner

FIG.12

| INPUT TO RESET CONTROL SECTION ||  OUTPUT FROM RESET CONTROL SECTION |
|---|---|---|
| REFERENCE SIGNAL REFR | DETECTION SIGNAL XEVENT | |
| INPUTTED | LOW LEVEL (EVENT HAS OCCURRED) | RESET SIGNAL RST |
| INPUTTED | HIGH LEVEL (NO EVENT HAS OCCURRED) | ----- |
| NOT INPUTTED | LOW LEVEL (EVENT HAS OCCURRED) | ----- |
| NOT INPUTTED | HIGH LEVEL (NO EVENT HAS OCCURRED) | ----- |

SOLID STATE IMAGING ELEMENT AND IMAGING DEVICE TO REDUCE CIRCUIT AREA OF A PIXEL

CROSS REFERENCE TO RELATED APPLICATIONS

This application is a U.S. National Phase of International Patent Application No. PCT/JP2020/046464 filed on Dec. 14, 2020, which claims priority benefit of Japanese Patent Application No. JP 2019-234168 filed in the Japan Patent Office on Dec. 25, 2019. Each of the above-referenced applications is hereby incorporated herein by reference in its entirety.

TECHNICAL FIELD

The present technology relates to a solid state imaging element. Specifically, the present technology relates to a solid state imaging element and an imaging device in which a brightness change amount is compared with a threshold.

BACKGROUND ART

Solid state imaging elements of a synchronization type that captures image data in synchronization with synchronization signals such as vertical synchronization signals, have been conventionally used for imaging devices. Such a typical solid imaging element of a synchronization type can acquire image data only at every cycle (e.g. 1/60 second) of synchronization signals. Therefore, in the traffic or robots-related field, for example, it is difficult to handle a high-speed process, if needed. To this end, a solid state imaging element of a non-synchronization type in which an address event in each pixel address is detected in real time on the basis of whether or not a brightness change amount in the pixel has exceeded a prescribed threshold, is proposed (see NPL 1, for example). Such a solid state imaging element in which an address event is detected in each pixel is called DVS (Dynamic Vision Sensor). In a DVS, a transistor that initiates a circuit for obtaining a brightness change amount, and a circuit that switches the transistor by suppling a slope-shaped signal to the gate of the transistor, are provided in each of pixels.

CITATION LIST

Non Patent Literature

[NPL 1]
Patrick Lichtsteiner, et al., A 128 128 120 dB 15 µs Latency Asynchronous Temporal Contrast Vision Sensor, IEEE JOURNAL OF SOLID-STATE CIRCUITS, VOL. 43, NO. 2, FEBRUARY 2008.

SUMMARY

Technical Problem

In the above-mentioned related technology, a slope-shaped signal is supplied to the gate of the transistor for performing initialization so that feed-through noise, which can be generated during switching of the transistor from an ON state to an OFF state, is suppressed. However, in order to generate a slope-shaped signal, addition of a capacity to each pixel is required. The addition of a capacity may bring about an increase of the circuit area in the pixel.

The present technology has been achieved in view of the above circumstances, and an object thereof is to reduce a circuit area in each pixel in a solid state imaging element in which whether or not an address event has occurred is detected.

Solution to Problem

The present technology has been achieved to solve the above-mentioned problem. A first aspect of the present technology is a solid state imaging element including a driving circuit that supplies a prescribed reference signal a level of which gradually fluctuates with lapse of time, and a plurality of pixels each including an auto-zero transistor that initializes a change amount acquisition section for obtaining a brightness change amount, and a reset control section that, in a case where a prescribed address event has occurred, switches the auto-zero transistor by using the reference signal. This provides an effect that the circuit area in each pixel can be reduced.

In addition, in the first aspect, a polarity of the auto-zero transistor may be an N type, the level of the reference signal may gradually decrease with lapse of time, the reset control section may include an inversion circuit that inverts a detection signal indicating a detection result of the address event and outputs the inverted signal to a gate of the auto-zero switch, and an N-type transistor that is disposed between an output node and a grounded node of the inversion circuit, and the inversion circuit may be disposed between an output node and a grounded node of the driving circuit. This provides an effect that the N-type transistor can be switched.

In addition, in the first aspect, a polarity of the auto-zero transistor may be a P type, the level of the reference signal may gradually increase with lapse of time, the reset control section may include an inversion circuit that inverts a detection signal indicating a detection result of the address event and outputs the inverted signal to a gate of the auto-zero switch, and a P-type transistor that is disposed between an output node and a grounded node of the inversion circuit, and the inversion circuit may be disposed between an output node and a power source node of the driving circuit. This provides an effect that the P-type transistor can be switched.

In addition, in the first aspect, the driving circuit may include a plurality of driver units that is connected to different rows, and the pixels may be arranged in a prescribed direction in each of the rows. This provides an effect that initialization in each row can be performed at different timings.

In addition, in the first aspect, the plurality of driver units may include operational amplifiers, and the solid state imaging element may further include a short circuit switch that short-circuits a path between each output node of the operational amplifiers. This provides an effect that fixed pattern noise having a stripe shape can be suppressed.

In addition, in the first aspect, the driving circuit may include a driver unit that generates the reference signal, and the driver unit may include an operational amplifier, a current source that is connected to an input terminal of the operational amplifier, a capacity that is disposed between the input terminal and an output terminal of the operational amplifier, and a short circuit switch that opens/closes a path between the input terminal and the output terminal. This provides an effect that a slope-shaped reference signal can be generated.

In addition, in the first aspect, the driver unit may further include a ground-side switch that opens/closes a path between the output terminal and a prescribed grounded node. This provides an effect that a rectangular signal can be generated.

In addition, in the first aspect, the driving circuit may include a driver unit that supplies the reference signal to each of the plurality of pixels. This provides an effect that the circuit scale of the driving circuit can be reduced.

In addition, in the first aspect, each of the pixels may include a logarithm response section that obtains a logarithm value of a photoelectric current, a differentiation circuit that differentiates the logarithm value, and outputs the differentiated value as a differentiated signal, a comparison circuit that compares the differentiated signal with a prescribed threshold, and the reset control section, and the change amount acquisition section and the auto-zero transistor may be disposed on the differentiation circuit. This provides an effect that whether or not an address event has occurred can be detected.

Moreover, a second aspect of the present technology is an imaging device including a driving circuit that supplies a prescribed reference signal a level of which gradually fluctuates with lapse of time, a plurality of pixels each including an auto-zero transistor that initializes a change amount acquisition section for obtaining a brightness change amount, and a reset control section that, in a case where a prescribed address event has occurred, switches the auto-zero transistor by using the reference signal, and a signal processing section that processes a detection signal indicating whether or not the address event has occurred. This provides an effect that the circuit area in each pixel for which whether or not an address event has occurred is detected, can be reduced.

BRIEF DESCRIPTION OF DRAWINGS

FIG. 12 is a diagram indicating a summary of operation of the reset control section according to the first embodiment of the present technology.

DESCRIPTION OF EMBODIMENTS

Hereinafter, embodiments for carrying out the present technology (hereinafter, referred to as embodiments) will be explained. The explanation will be given according to the following order.

1. First Embodiment (in which a driving circuit generates a slope-shaped signal)
2. Second Embodiment (in which a driving circuit generates a slope-shaped signal, and a P-type auto-zero switch is used)
3. Third Embodiment (in which a driving circuit generates a slope-shaped signal to eliminate fixed pattern noise)
4. Fourth Embodiment (in which a driving circuit generates a slope-shaped signal or a rectangular signal)
5. Fifth Embodiment (in which one unit on a driving circuit generates a slope-shaped signal)
6. Examples of Application to Mobile Body 1. First Embodiment

[Configuration Example of Imaging Device]

Figure 1:
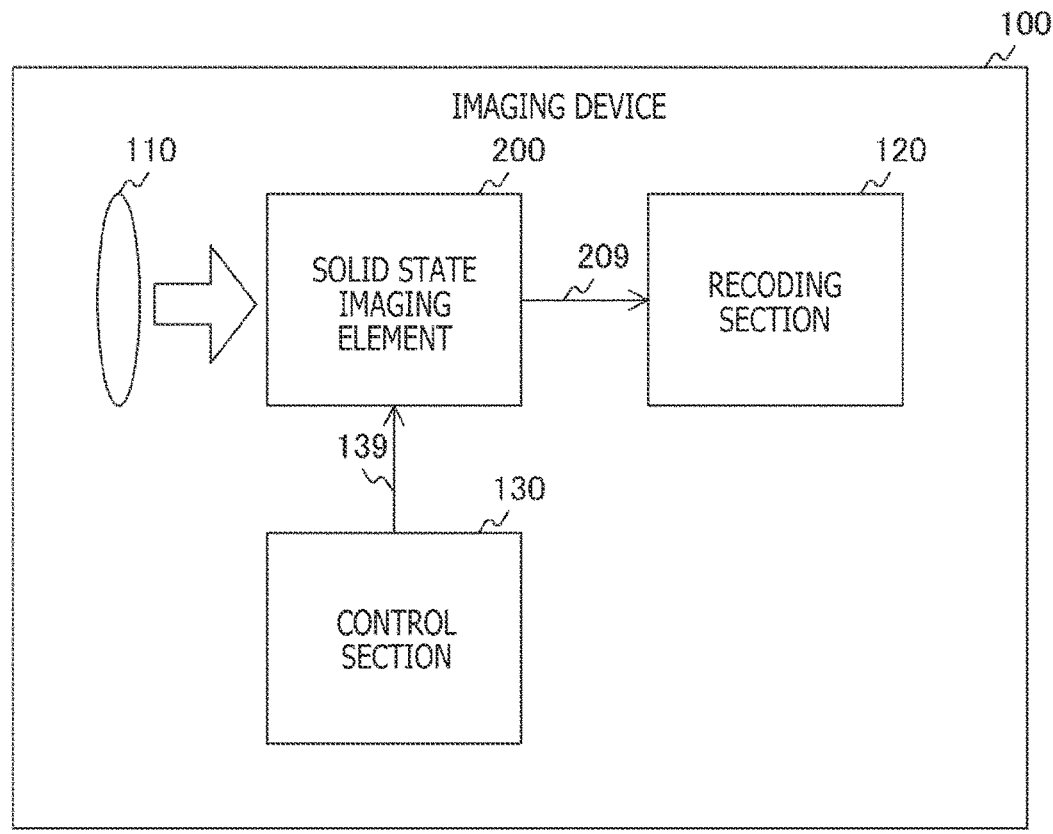
FIG. 1 is a block diagram depicting one configuration example of an imaging device according to a first embodiment of the present technology.

FIG. 1 is a block diagram depicting one configuration example of an imaging device 100 according to the first embodiment of the present technology. The imaging device 100 includes an imaging lens 110, a solid state imaging element 200, a recoding section 120, and a control section 130. For example, a camera mounted on an industrial robot or a camera mounted on a vehicle is assumed as the imaging device 100.

The imaging lens 110 collects incident light and guides the incident light to the solid state imaging element 200. The solid state imaging element 200 captures image data by performing photoelectric conversion of the incident light. The solid state imaging element 200 performs prescribed signal processing such as image recognition processing on the captured image data, and outputs the processing result to the recoding section 120 through a signal line 209.

The recoding section 120 records the data supplied from the solid state imaging element 200. The control section 130 controls the solid state imaging element 200 to capture image data.

[Configuration Example of Solid State Imaging Element]

Figure 2:
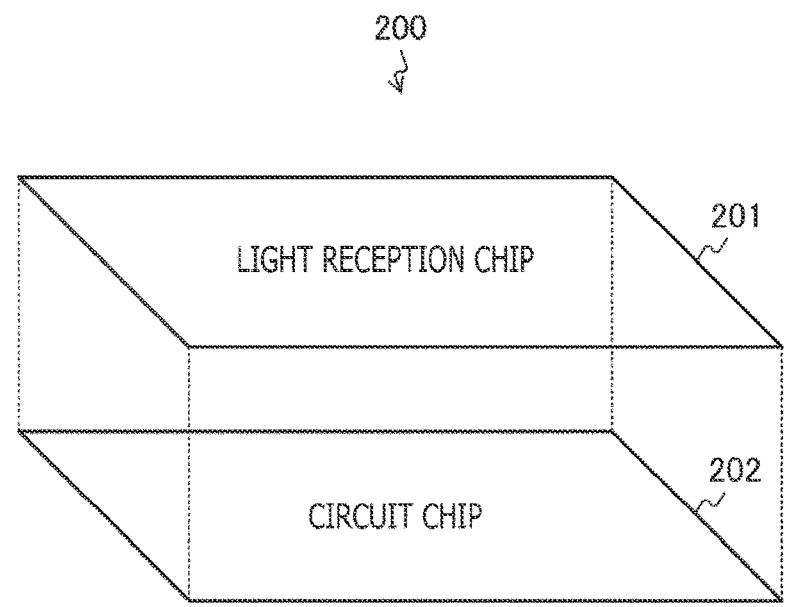
FIG. 2 is a diagram depicting one example of a layered structure of a solid state imaging element according to the first embodiment of the present technology.

FIG. 2 is a diagram depicting one example of a layered structure of the solid state imaging element 200 according to the first embodiment of the present technology. The solid state imaging element 200 includes a circuit chip 202, and a light reception chip 201 layered on the circuit chip 202. These chips are electrically connected via a connection part such as a via. The connection may be established by Cu—Cu bonding or a bump in place of the via.

[Configuration Example of Light Reception Chip]

Figure 3:
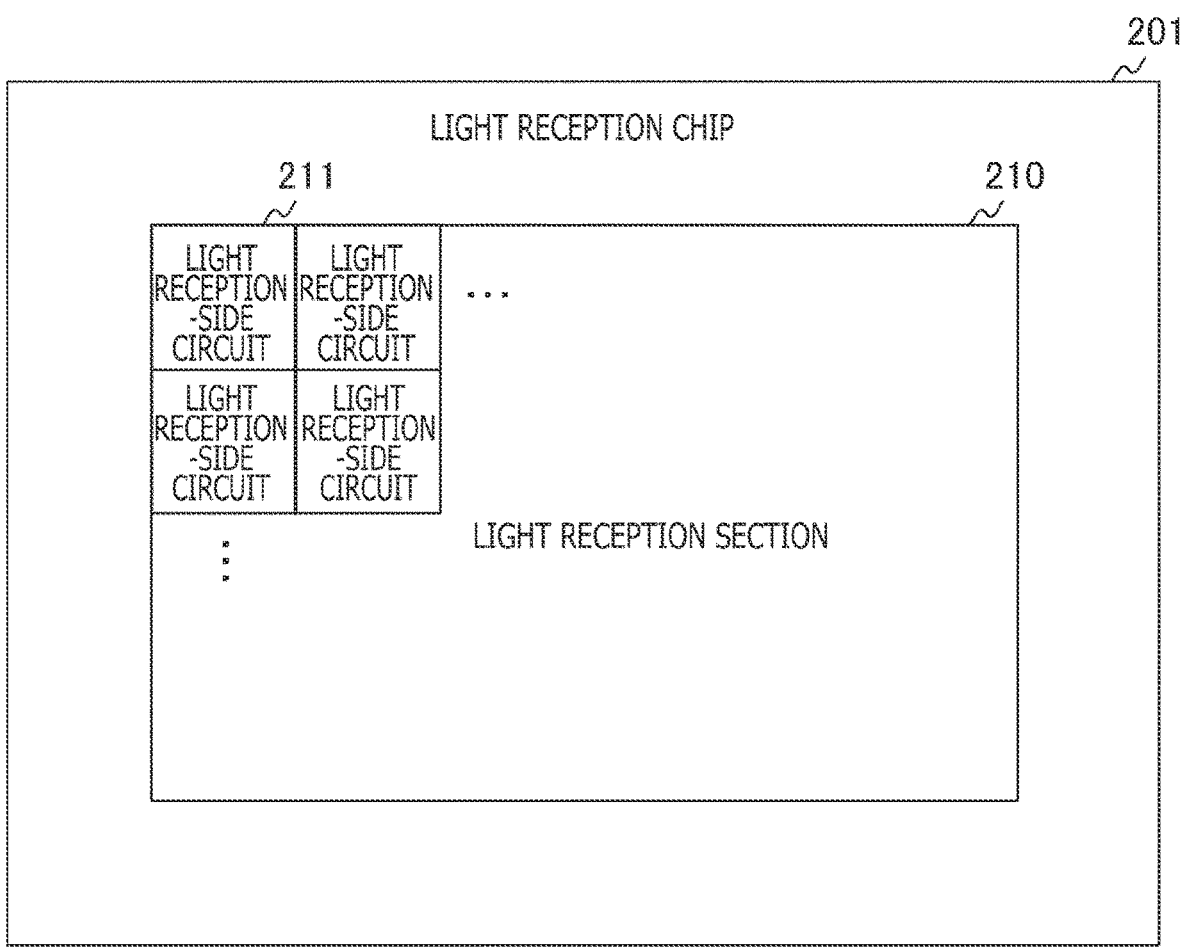
FIG. 3 is a plan view of one configuration example of a light reception chip according to the first embodiment of the present technology.

FIG. 3 is a plan view of one configuration example of the light reception chip 201 according to the first embodiment of the present technology. On the light reception chip 201, a plurality of light reception-side circuits 211 is arranged in a two-dimensional lattice form. The circuit configuration of each light reception-side circuit 211 will be explained later.

[Configuration Example of Circuit Chip]

Figure 4:
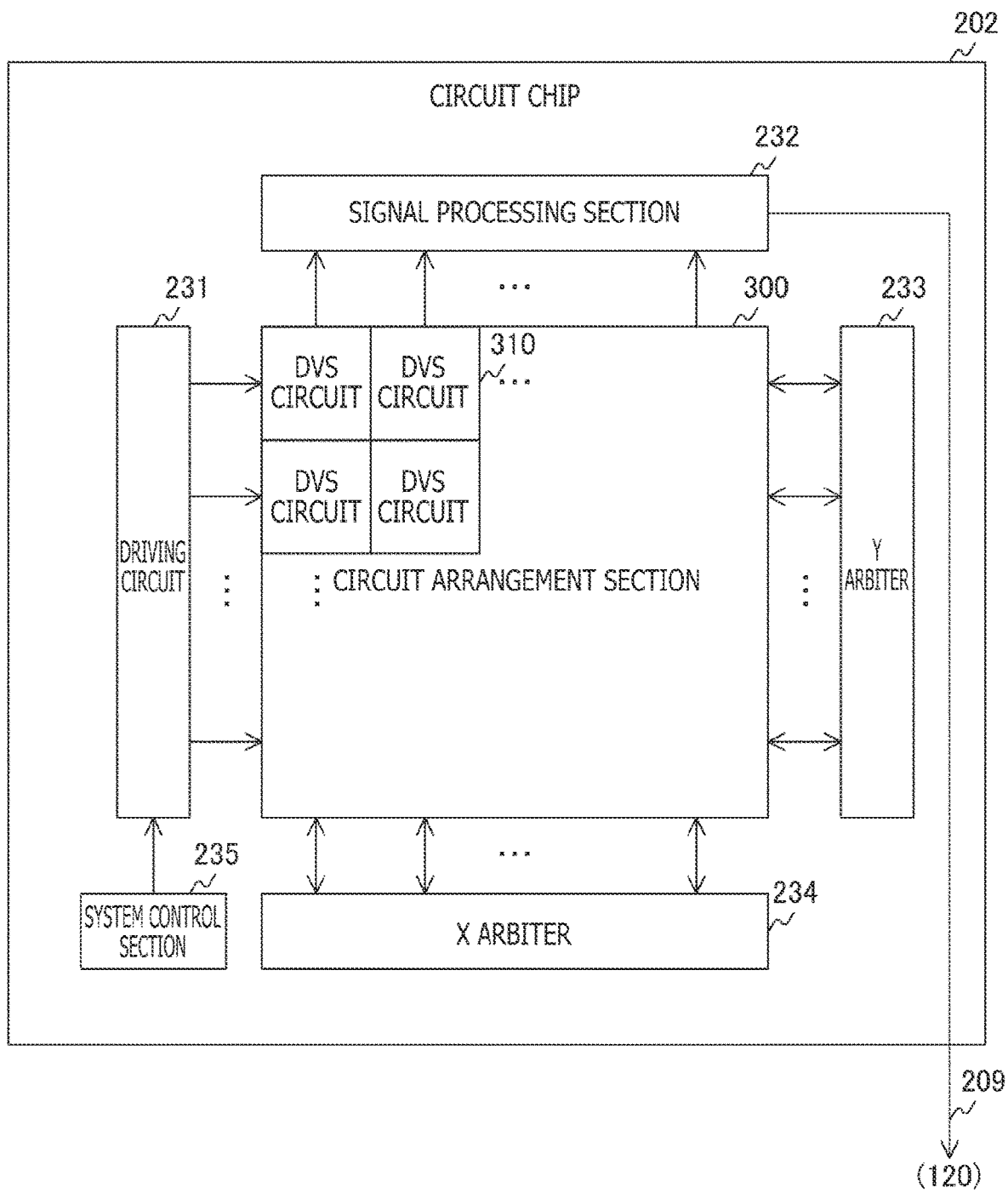
FIG. 4 is a block diagram depicting one configuration example of a circuit chip according to the first embodiment of the present technology.

FIG. 4 is a block diagram depicting one configuration example of the circuit chip 202 according to the first embodiment of the present technology. A driving circuit 231, a signal processing section 232, a Y arbiter 233, an X arbiter 234, a system control section 235, and a circuit arrangement section 300 are disposed on the circuit chip 202.

A plurality of DVS circuits 310 is arranged in a two-dimensional lattice form in the circuit arrangement section 300. The DVS circuits 310 are disposed respectively for the light reception-side circuits 211 and are electrically connected to the corresponding light reception-side circuits 211. A circuit including one of the light reception-side circuits 211 and the corresponding DVS circuit 310 functions as a single pixel for which whether or not an address event has occurred is detected.

Hereinafter, a group of pixels that are arranged in a prescribed horizontal direction is referred to as "row," while a group of pixels that are arranged in a direction perpendicular to each row is referred to as "column."

Each of the DVS circuits 310 detects whether or not an address event has occurred. When detecting an address event, the DVS circuit 310 supplies, to the Y arbiter 233 and the X arbiter 234, a request to output a detection signal regarding the address event, and supplies the detection signal to the signal processing section 232 on the basis of the arbitration results thereof.

The driving circuit 231 drives the pixels separately. The Y arbiter 233 arbitrates requests transmitted from the each row and returns responses on the basis of the arbitration result. The X arbiter 234 arbitrates requests transmitted from the each column and returns responses on the basis of the arbitration result. The system control section 235 controls each operation timing of the circuits including the driving circuit 231 on the circuit chip 202.

The signal processing section 232 performs prescribed signal processing such as image recognition processing on detection signals supplied from the each DVS circuit 310. The signal processing section 232 supplies data indicating the processing result to the recoding section 120 via the signal line 209.

[Configuration Example of Driving Circuit]

Figure 5:
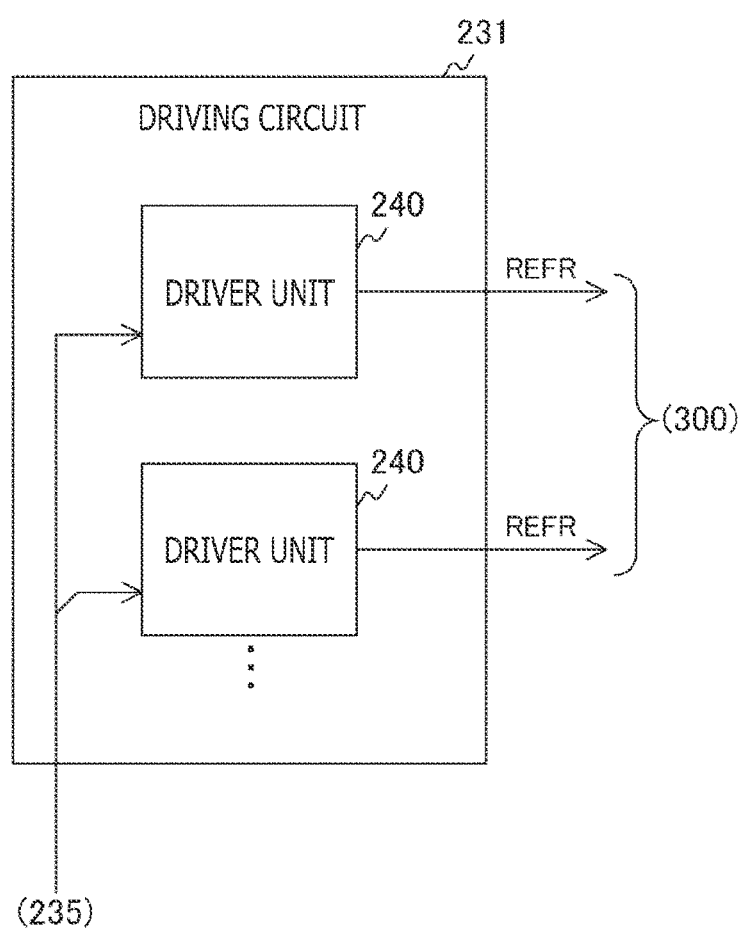
FIG. 5 is a block diagram depicting one configuration example of a driving circuit according to the first embodiment of the present technology.

FIG. 5 is a block diagram depicting one configuration example of the driving circuit 231 according to the first embodiment of the present technology. The driving circuit 231 includes a plurality of driver units 240. The driver units 240 are disposed for each row. When the number of the rows is N (N is an integer), N driver units 240 are disposed.

Under control of the system control section 235, the driver units 240 each generate a reference signal REFR the level of which gradually fluctuates with lapse of time. The driver unit 240 outputs the reference signal REFR to the corresponding row in the circuit arrangement section 300. The system control section 235 controls the N driver units 240 separately to generate the reference signals REFR in a prescribed order. In addition, for each of the rows, the reference signal REFR is generated each time a fixed period passes.

[Configuration Example of Driver Unit]

Figure 6:
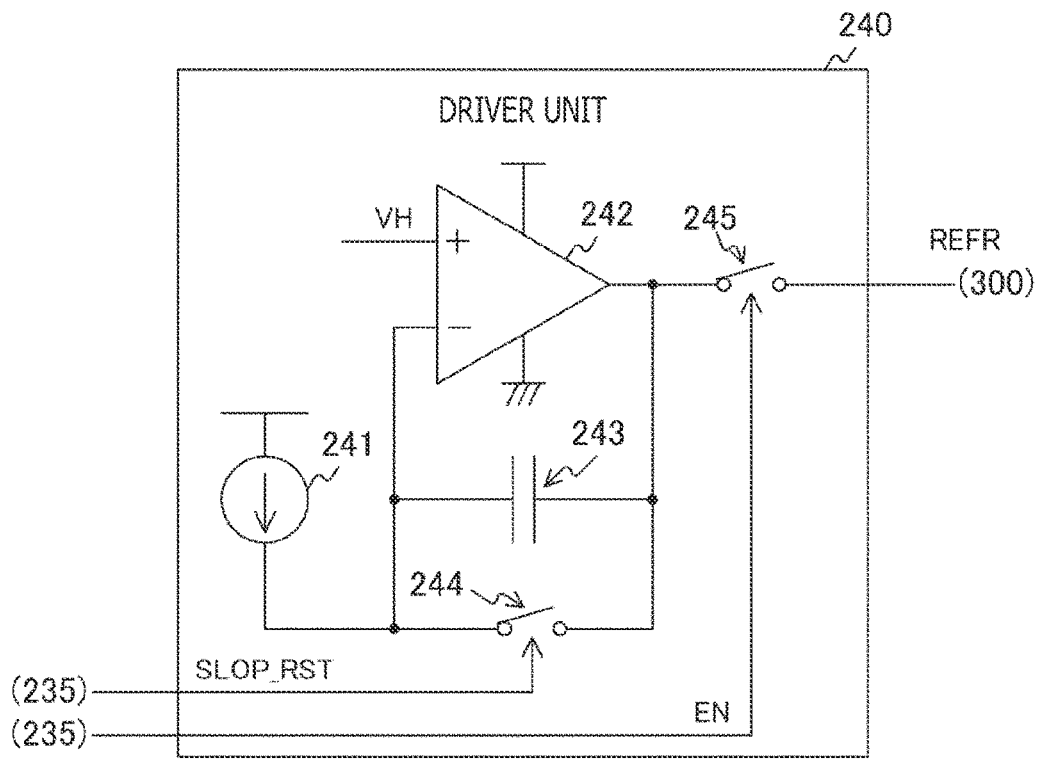
FIG. 6 is a circuit diagram depicting one configuration example of a driver unit according to the first embodiment of the present technology.

FIG. 6 is a circuit diagram depicting one configuration example of the driver unit 240 according to the first embodiment of the present technology. The driver unit 240 includes a current source 241, an operational amplifier 242, a capacity 243, a short circuit switch 244, and an enable switch 245.

The current source 241 is disposed between a power source node and an inverted input terminal (−) of the operational amplifier 242. A prescribed high level VH which is higher than a grounded node is inputted to a non-inverted input terminal (+) of the operational amplifier 242. In addition, an output terminal of the operational amplifier 242 is connected to the enable switch 245. The capacity 243 is disposed between the inverted input terminal (−) and the output terminal of the operational amplifier 242.

The short circuit switch 244 opens/closes a path between the inverted input terminal (−) and the output terminal of the operational amplifier 242 according to a reset signal SLOP_RST supplied from the system control section 235.

The enable switch 245 opens/closes a path between the output terminal of the operational amplifier 242 and the corresponding row in the circuit arrangement section 300 according to an enable signal EN supplied from the system control section 235.

Figure 7:
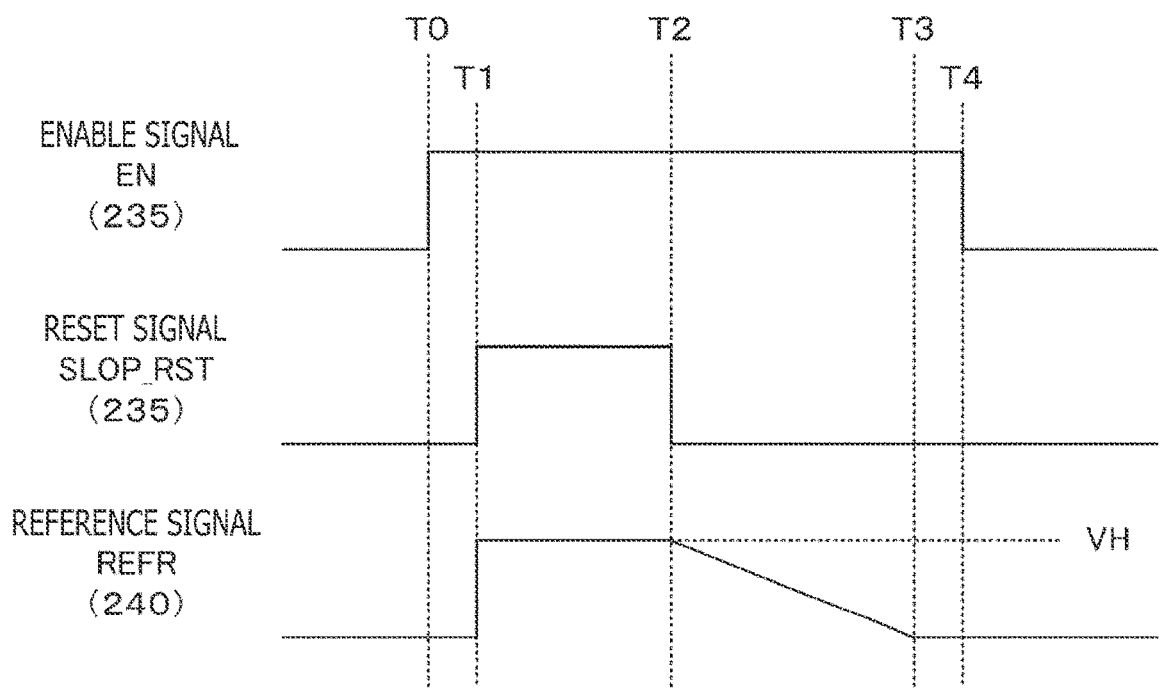
FIG. 7 is a timing chart depicting one example of operation of the driver unit according to the first embodiment of the present technology.

FIG. 7 is a timing chart depicting one example of operation of the driver unit 240 according to the first embodiment of the present technology. The system control section 235 supplies an enable signal EN of high level during a time period from timing T0 to T4. Further, the system control section 235 supplies a reset signal SLOP_RST of high level during a time period from timing T1 which is immediately after timing T0, to timing T2.

Under the above-mentioned control, the driver unit 240 supplies a reference signal REFR of high level VH during the time period from timing T1 to T2. Further, the driver unit 240 supplies a reference signal REFR the level of which decreases gradually with lapse of time, during the time period from timing T2 to T3.

[Configuration Example of Pixel]

Figure 8:
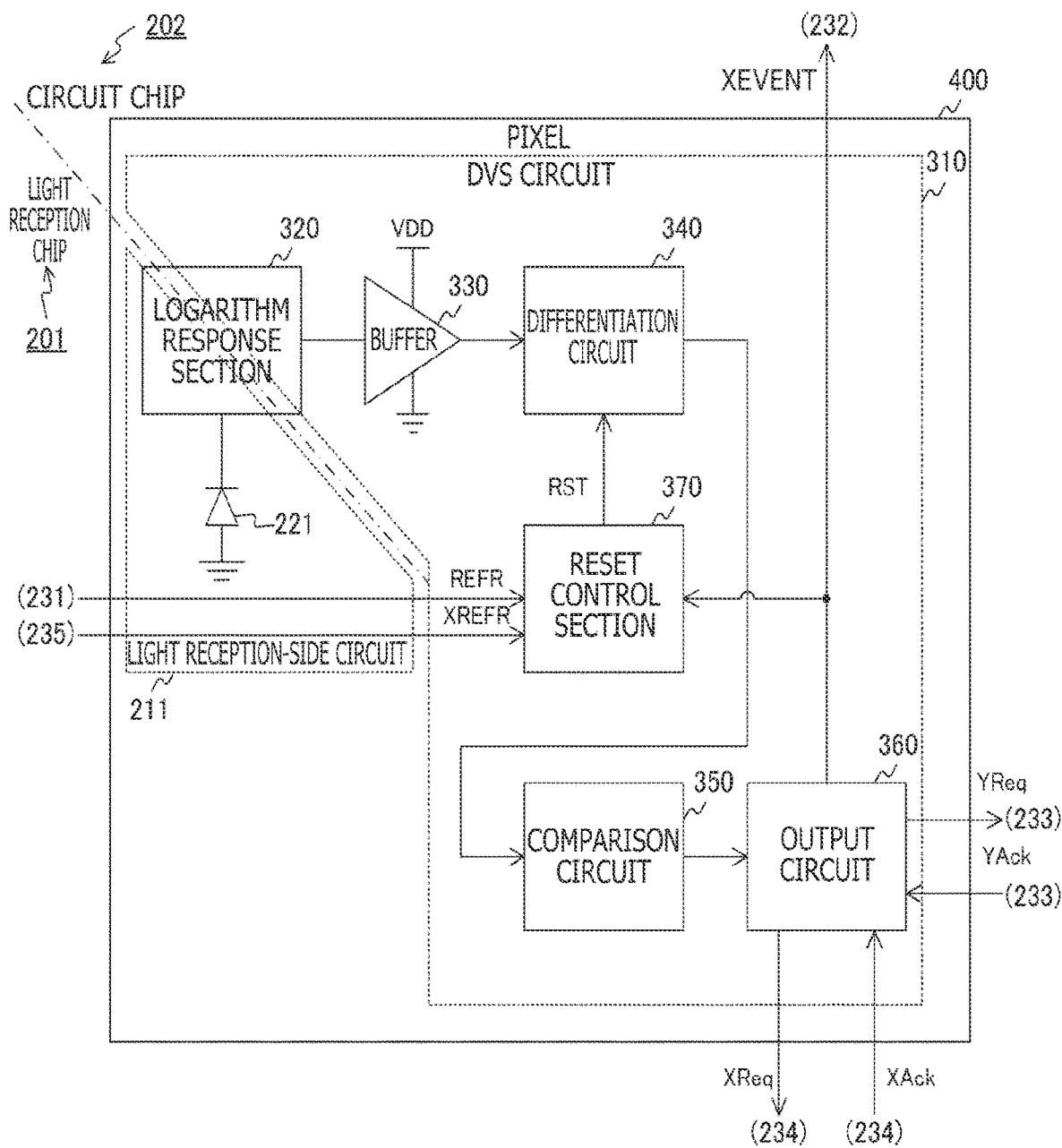
FIG. 8 is a block diagram depicting one configuration example of a pixel according to the first embodiment of the present technology.

FIG. 8 is a block diagram depicting one configuration example of a pixel 400 according to the first embodiment of the present technology. The pixel 400 includes a photoelectric conversion element 221, a logarithm response section 320, a buffer 330, a differentiation circuit 340, a comparison circuit 350, an output circuit 360, and a reset control section 370.

The photoelectric conversion element 221 generates electric charge, and outputs, to the logarithm response section 320, photoelectric current depending on the amount of the electric charge.

The logarithm response section 320 transforms the photoelectric current outputted from the photoelectric conversion element 221, to a voltage signal indicating the logarithm of the photoelectric current. The logarithm response section 320 supplies the voltage signal to the buffer 330.

The buffer 330 outputs the voltage signal supplied from the logarithm response section 320, to the differentiation circuit 340.

The differentiation circuit 340 differentiates the voltage signal under control of the driving circuit 231 and generates a differentiated signal that indicates the differentiated value. The differentiation circuit 340 outputs the differentiated signal to the comparison circuit 350. The differentiated signal indicates the change an amount of the photoelectric current.

The comparison circuit 350 compares the differentiated signal (i.e. change amount) with a prescribed threshold. The comparison circuit 350 outputs the comparison result to the output circuit 360. The comparison result indicates whether or not an address event has occurred.

The output circuit 360 outputs a detection signal XEVENT which indicates whether or not an address event has occurred, to the signal processing section 232. When an address event has occurred, the output circuit 360 supplies requests YReq and XReq for transmission of a detection signal, to the Y arbiter 233 and the X arbiter 234. After receiving responses YAck and XAck from the Y arbiter 233 and the X arbiter 234 in response to the requests, the output circuit 360 outputs a detection signal XEVENT to the signal processing section 232 and the reset control section 370.

On the basis of the detection signal XEVENT, the reference signal REFR supplied from the driving circuit 231, and a reference signal XREFR supplied from the system control section 235, the reset control section 370 supplies a reset signal RST to the differentiation circuit 340.

In addition, the photoelectric conversion element 221 and a portion of the logarithm response section 320 constitute the light reception-side circuit 211 disposed on the light reception chip 201. The remaining portion of the logarithm response section 320, the differentiation circuit 340, and the succeeding circuits constitute the DVS circuit 310 disposed on the circuit chip 202.

[Circuit Example of Pixel]

Figure 9:
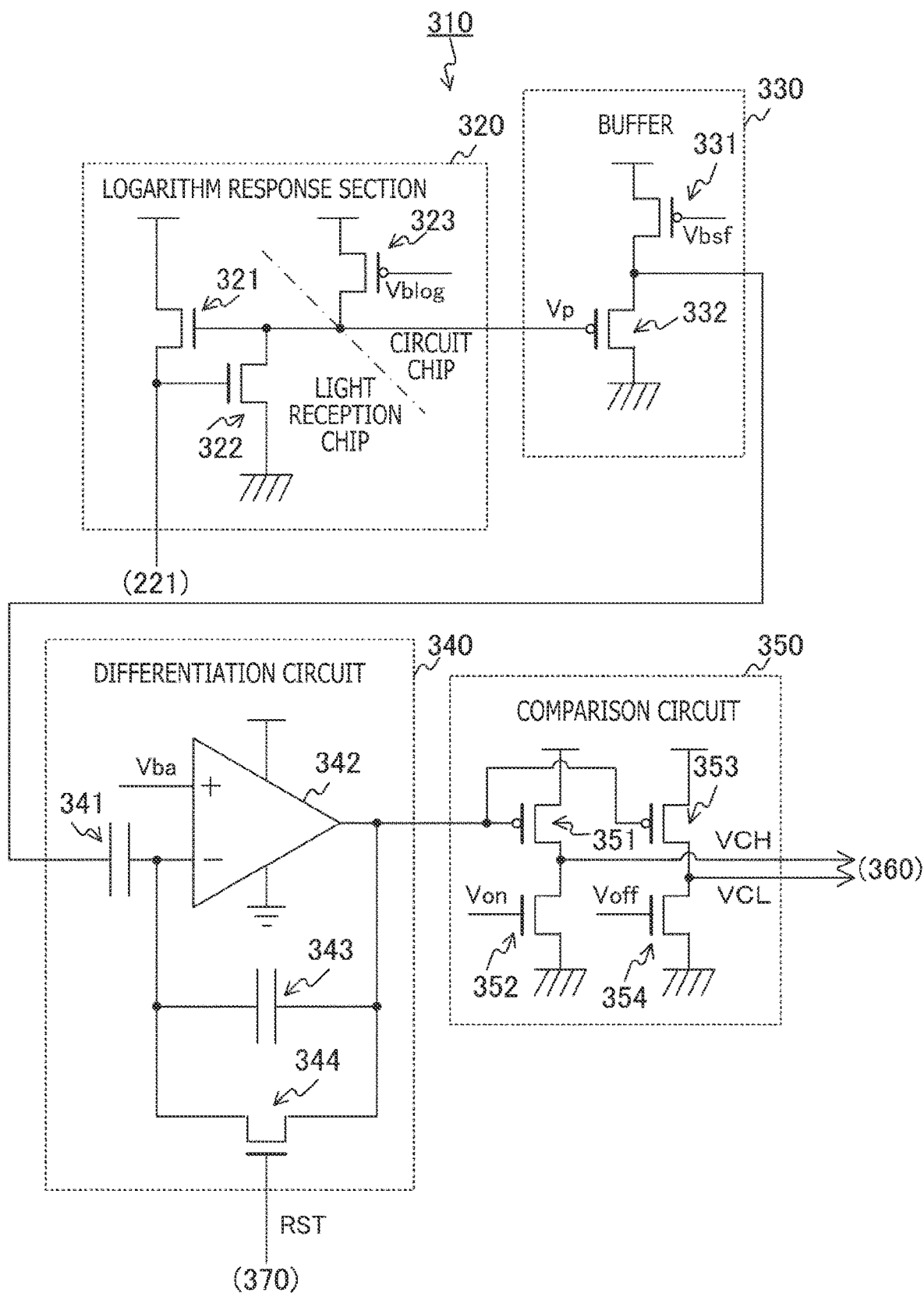
FIG. 9 is a circuit diagram depicting one configuration example including a logarithm response section, a buffer, a differentiation circuit, and a comparison circuit according to the first embodiment of the present technology.

FIG. 9 is a circuit diagram depicting one configuration example including the logarithm response section 320, the buffer 330, the differentiation circuit 340, and the comparison circuit 350 according to the first embodiment of the present technology.

The logarithm response section 320 includes nMOS (negative channel MOS) transistors 321 and 322, and a pMOS (positive channel MOS) transistor 323. The nMOS transistors 321 and 322 and the photoelectric conversion element 221 are disposed on the light reception chip 201. On the other hand, the pMOS transistor 323 and the succeeding circuits are disposed on the circuit chip 202.

The pMOS transistor 323 and the nMOS transistor 322 are connected in series between a power source and a grounded terminal. Moreover, the gate of the nMOS transistor 321 is connected to a connection point between the pMOS transistor 323 and the nMOS transistor 322, the source of the nMOS transistor 321 is connected to the photoelectric conversion element 221, and the drain of the nMOS transistor 321 is connected to a power source terminal. A bias voltage Vblog is applied to the gate of the pMOS transistor 323. As a result of such a connection, a photoelectric current flowing through the photoelectric conversion element 221 is logarithmically transformed to a voltage Vp.

Furthermore, the photoelectric conversion element 221 is disposed on the light reception chip 201, and the remaining circuits are disposed on the circuit chip 202. Moreover, the ground of the light reception chip 201 is separated from the ground of the circuit chip 202 in order to prevent an interference.

Moreover, the buffer 330 includes pMOS transistors 331, 332 that are connected in series between a power source and a grounded terminal. The gate of the pMOS transistor 332 which is on a ground side is connected to the logarithm response section 320. A bias voltage Vbsf is applied to the gate of the pMOS transistor 331 which is on a power source side. Furthermore, a connection point between the pMOS transistors 331 and 332 is connected to the differentiation circuit 340. As a result of such a connection, impedance transformation of Vp is performed.

The differentiation circuit 340 includes capacities 341 and 343, an operational amplifier 342, and an auto-zero transistor 344.

A bias voltage Vba is applied to a non-inverted input terminal (+) of the operational amplifier 342. The capacity 341 is disposed between an inverted input terminal (−) of the operational amplifier 342 and the buffer 330. The capacity 343 is disposed between the inverted input terminal (−) and an output terminal of the operational amplifier 342.

The auto-zero transistor 344 opens/closes a path between the inverted input terminal (−) and the output terminal of the operational amplifier 342 according to a reset signal RST supplied from the reset control section 370. For example, an nMOS transistor is used as the auto-zero transistor 344.

As a result of the above connection, a differentiated signal is generated and is outputted to the comparison circuit 350. In addition, the differentiated signal is initialized by a reset signal RST.

The comparison circuit 350 includes pMOS transistors 351 and 353 and nMOS transistors 352 and 354. The pMOS transistor 351 and the nMOS transistor 352 are connected in series between a power source and a grounded terminal. The pMOS transistor 353 and the nMOS transistor 354 are also connected in series between a power source and a grounded terminal. In addition, the gates of the pMOS transistors 351 and 353 are connected to the differentiation circuit 340. A prescribed upper limit threshold Von is applied to the gate of the nMOS transistor 352. A prescribed lower limit threshold Voff is applied to the gate of the nMOS transistor 354.

A connection point between the pMOS transistor 351 and the nMOS transistor 352 is connected to the output circuit 360, and a voltage at the connection point is outputted as a comparison result VCH. A connection point between the pMOS transistor 353 and the nMOS transistor 354 is also connected to the output circuit 360, and a voltage at the connection point is outputted as a comparison result VCL. As a result of such a connection, the comparison circuit 350 outputs the comparison result VCH of high level in a case where the differentiated signal exceeds the upper limit threshold Von, and the comparison circuit 350 outputs the comparison result VCL of low level in a case where the differentiated signal becomes below the lower limit threshold Voff. The comparison result VCH indicates a detection result of an ON event. The comparison result VCL indicates a detection result of an OFF event.

It is to be noted that the comparison circuit 350 may detect either one of an ON event and an OFF event only although the comparison circuit 350 detects both of the events in the above explanation. For example, in a case where the comparison circuit 350 detects an ON event only, only the pMOS transistor 351 and the nMOS transistor 352 which handle an ON event are provided.

[Configuration Example of Reset Control Section]

Figure 10:
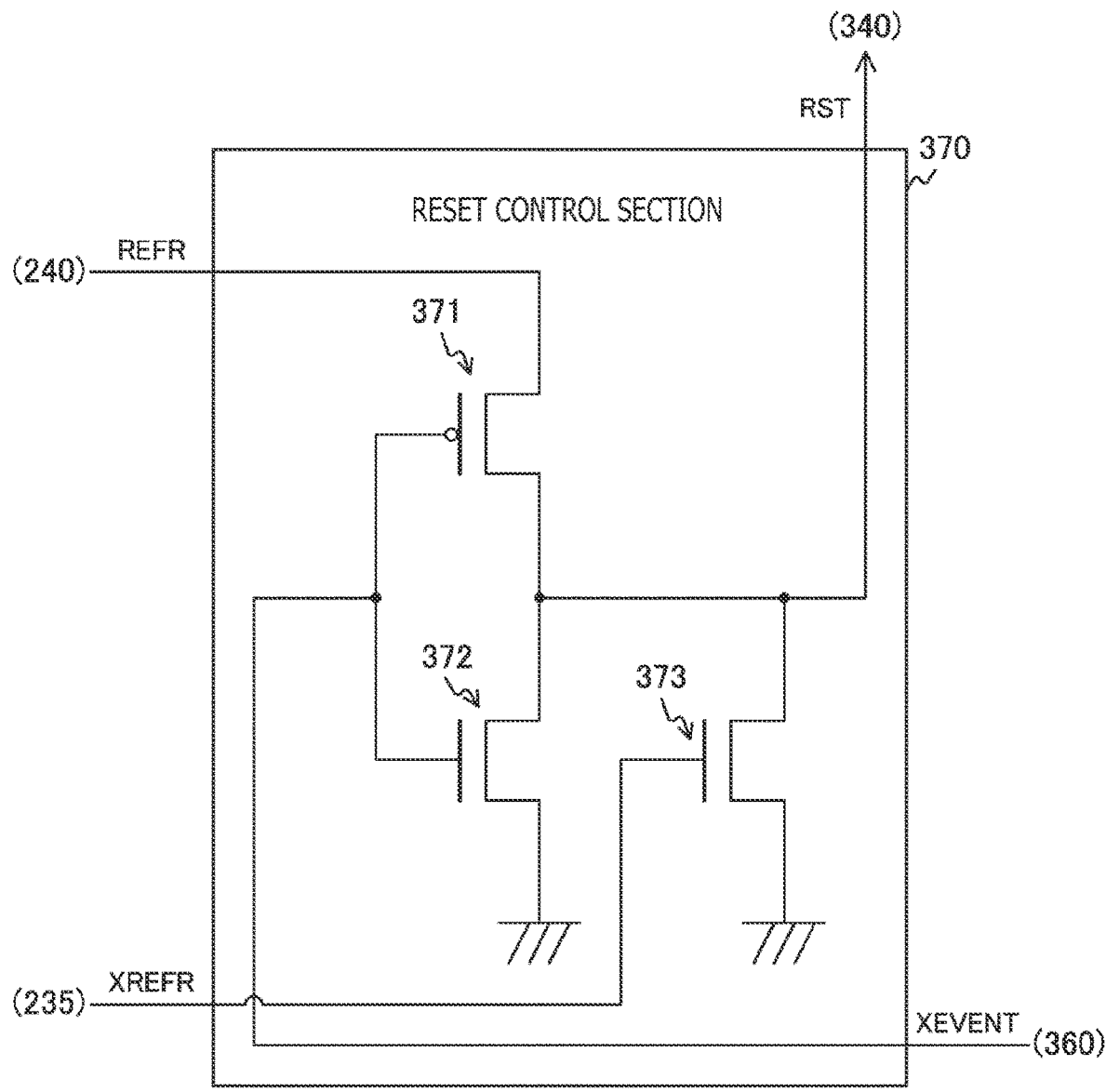
FIG. 10 is a circuit diagram depicting one configuration example of a reset control section according to the first embodiment of the present technology.

FIG. 10 is a circuit diagram depicting one configuration example of the reset control section 370 according to the first embodiment of the present technology. The reset control section 370 includes a pMOS transistor 371 and nMOS transistors 372 and 373.

The pMOS transistor 371 and the nMOS transistor 372 are connected in series between an output node of the driver unit 240 and a grounded node. In addition, a detection signal XEVENT supplied from the output circuit 360 is inputted to the gates of the pMOS transistor 371 and the nMOS transistor 372. As a result of such a connection, the pMOS transistor 371 and the nMOS transistor 372 function as an inverting circuit that inverts a detection signal XEVENT. Moreover, a reset signal RST is outputted from a connection node between the pMOS transistor 371 and the nMOS transistor 372 to the differentiation circuit 340.

The nMOS transistor 373 is disposed between a grounded node and a connection node (i.e. the output node of the inverting circuit) between the pMOS transistor 371 and the nMOS transistor 372. Moreover, a reference signal XREFR supplied from the system control section 235 is inputted to the gate of the nMOS transistor 373.

It is to be noted that the grounded node of the reset control section 370 does not need to be shared by the differentiation circuit 340.

Figure 11A:
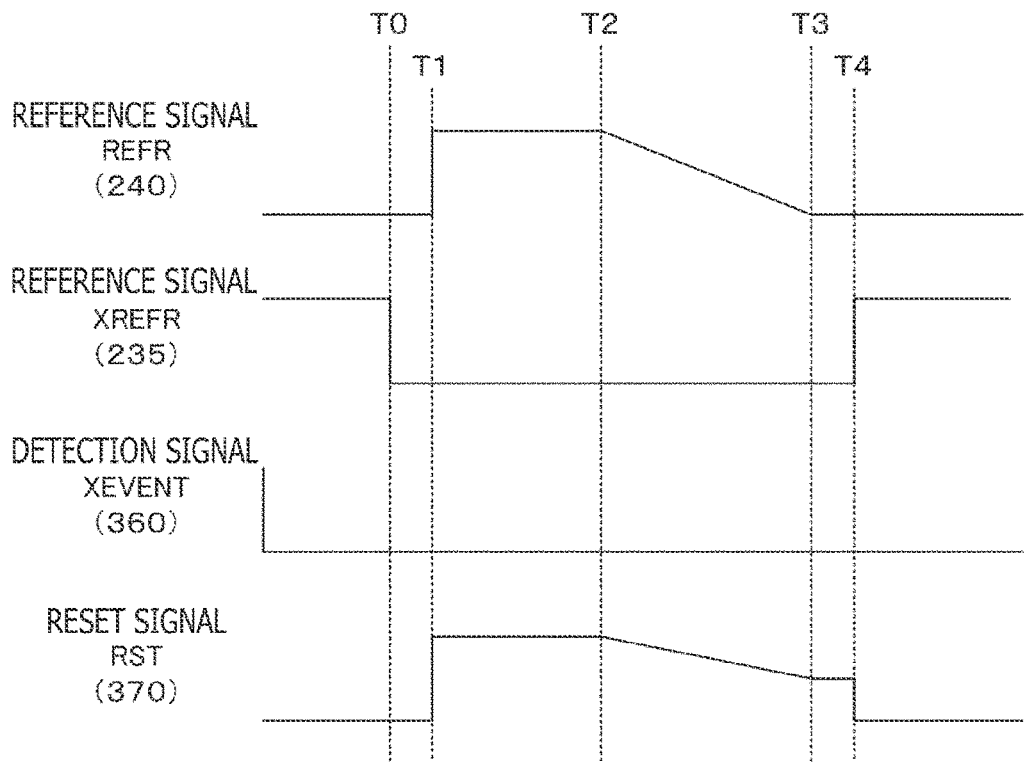
FIGS. 11A and 11B depict timing charts each depicting one example of operation of the reset control section according to the first embodiment of the present technology.
Figure 11B:
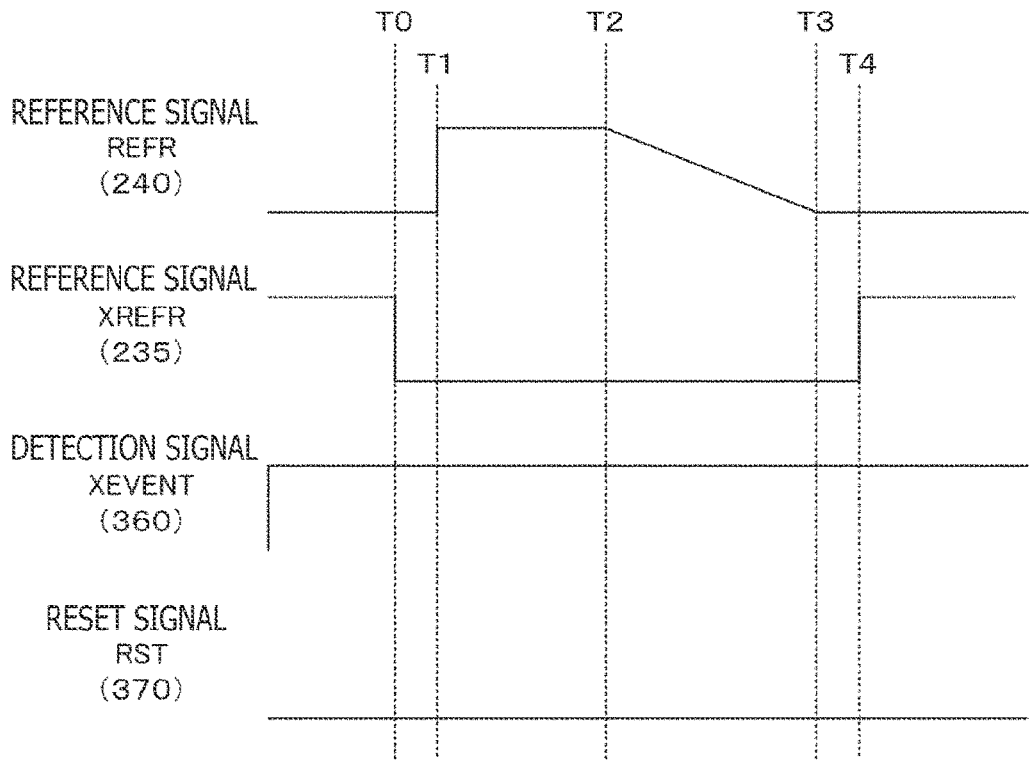

FIGS. 11A and 11B depict timing charts each depicting one example of operation of the reset control section 370 according to the first embodiment of the present technology. In FIGS. 11A and 11B, FIG. 11A is a timing chart depicting one example of operation of the reset control section 370 in a case where an address event has occurred, while FIG. 11B is a timing chart depicting one example of operation of the reset control section 370 in a case where no address event has occurred.

As depicted in FIG. 11A, in a case where an address event has occurred, the output circuit 360 supplies a detection signal XEVENT of low level. Further, the system control section 235 keeps the reference signal XREFR at low level during a time period from timing T0 to T4.

The driver unit 240 supplies a reference signal REFR of high level during a time period from timing T1 which is immediately after timing T0, to timing T2. Subsequently, the driver unit 240 gradually lowers the level of the reference signal REFR during a time period from timing T2 to timing T3, which is immediately before timing 14.

The reset control section 370 supplies a reset signal RST of high level during the time period timing T1 to T2, and then, gradually lowers the level of the reset signal RST during a time period from timing T2 to T3.

In contrast, as depicted in FIG. 11B, in a case where no address event has occurred, the output circuit 360 supplies a detection signal XEVENT of high level. The waveforms of the reference signals REFR and XREFR in FIG. 11B are identical to those in FIG. 11A. In addition, the reset control section 370 refrains from outputting a reset signal RST.

As depicted in FIGS. 11A and 11B, in a case where an address event has occurred, the reset control section 370 generates a slope-shaped reset signal RST by using a reference signal REFR. With the slope-shaped reset signal RST, gradual transition from an ON state to an OFF state of the auto-zero transistor 344 can be achieved. As a result, electric charge can be gradually extracted from a junction capacity between, for example, the gate and the source of the auto-zero transistor 344. Accordingly, reset feed through noise which occurs due to coupling of the junction capacity can be suppressed.

As depicted in the third circuit from the left in b of FIG. 2 in NPL 1, there has been a configuration in which a circuit including a capacity and a transistor is provided in a pixel to generate a slope-shaped signal. This configuration is used as a comparison embodiment, here. In the comparison embodiment, in order to generate a slope-shaped signal, a capacity is necessary for each pixel. This may bring about an increase of the circuit area in the pixel. On the other hand, as depicted in FIGS. 11A and 11B, when the driver unit 240 which is external to the pixel 400, generates a slope-shaped reference signal XREFR, any capacity for generating a slope-shaped signal is not necessary for the pixel 400. Consequently, the circuit area in each pixel can be reduced, compared to the comparison embodiment.

FIG. 12 is a diagram indicating a summary of operation of the reset control section 370 according to the first embodiment of the present technology. In a case where a reference signal REFR is inputted to the reset control section 370 and a detection signal XEVENT is at low level (that is, an address event has occurred), a slope-shaped reset signal RST is generated with use of the reference signal REFR.

On the other hand, in a case where a reference signal REFR is not inputted to the reset control section 370 or in a case where a detection signal XEVENT is at high level (that is, no address event has occurred), no reset signal RST is outputted.

Figure 13:
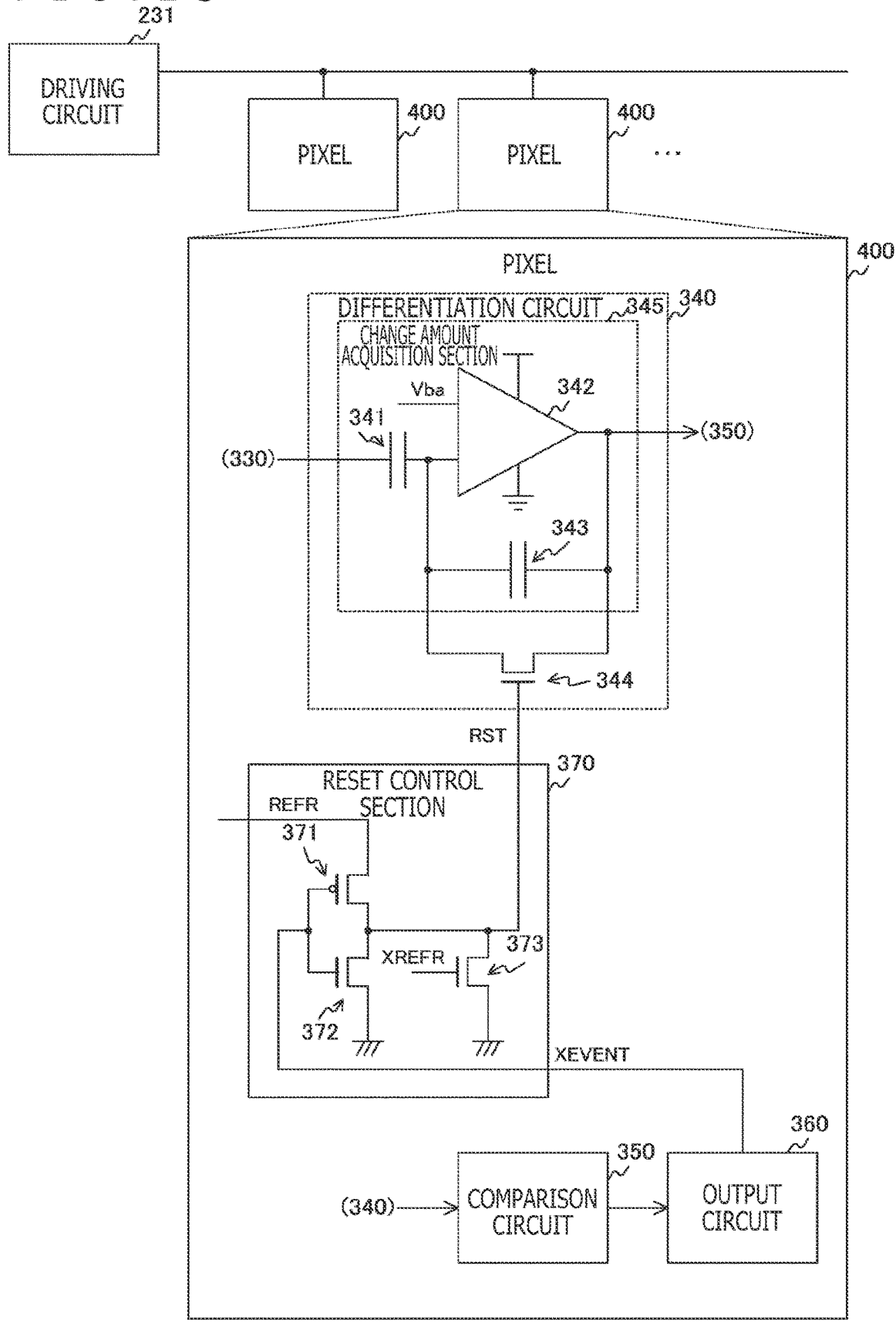
FIG. 13 is one example of the overall view of the solid state imaging element according to the first embodiment of the present technology.

FIG. 13 is one example of the overall view of the solid state imaging element 200 according to the first embodiment of the present technology. At a reset timing, the driving circuit 231 supplies a prescribed reference signal REFR the level of which gradually fluctuates with lapse of time, to each of the pixels 400.

In each pixel 400, the differentiation circuit 340, the comparison circuit 350, the output circuit 360, and the reset control section 370 are disposed. The circuits preceding the differentiation circuit 340 are omitted in FIG. 13.

A circuit including the capacities 341 and 343 and the operational amplifier 342 in the differentiation circuit 340 functions as a change amount acquisition section 345 that obtains a brightness change amount. In addition, the auto-zero transistor 344 in the differentiation circuit 340 initializes the change amount acquisition section 345 according to a reset signal RST.

The comparison circuit 350 compares a differentiated signal indicating the change amount with a threshold. On the basis of the comparison result, the output circuit 360 outputs a detection signal XEVENT to the reset control section 370.

In a case where the detection signal XEVENT is at low level (that is, an address event has occurred), the reset control section 370 switches the auto-zero transistor 344 by using the reset signal RST according to the reference signal REFR.

Since the reset signal RST has a slope shape, gradual transition from an ON state to an OFF state of the auto-zero transistor 344 can be achieved. Accordingly, reset feed through noise can be suppressed. In addition, since a slope-shaped reference signal REFR is generated by the driving circuit 231 which is external to the pixels 400, a capacity for generating a slope-shaped signal is not necessary for the pixels 400. Consequently, a circuit area in each pixel 400 can be reduced.

According to the first embodiment of the present technology, the driving circuit 231 which is external to the pixels 400, supplies a reference signal REFR the level of which gradually fluctuates, to each of the pixels 400 in the above-mentioned manner. Therefore, a capacity for generating a slope-shaped signal is not necessary for each of the pixels 400. Consequently, a circuit area in each pixel 400 can be reduced.

2. Second Embodiment

In the above-mentioned first embodiment, an nMOS transistor is used as the auto-zero transistor 344. Alternatively, not an nMOS transistor but a pMOS transistor can be used therefor. In the solid state imaging element 200 of the second embodiment, a pMOS transistor is provided as an auto-zero transistor. This is a difference from the first embodiment.

Figure 14:
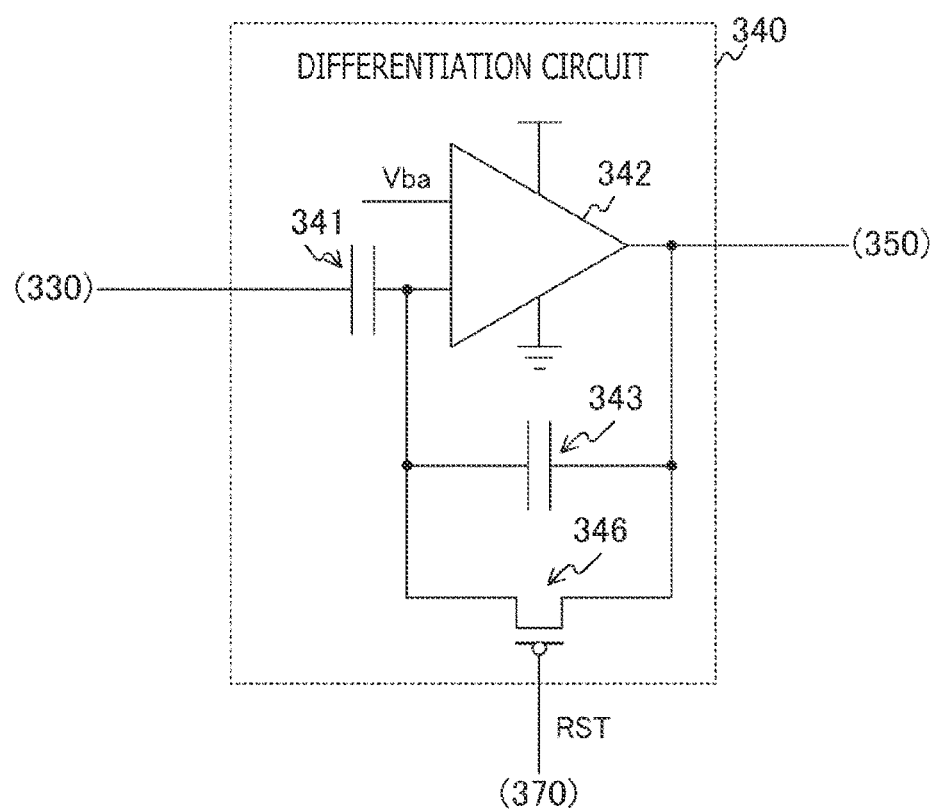
FIG. 14 is a circuit diagram depicting one configuration example of a differentiation circuit according to a second embodiment of the present technology.

FIG. 14 is a circuit diagram depicting one configuration example of the differentiation circuit 340 according to the second embodiment of the present technology. The differentiation circuit 340 according to the second embodiment differs from that of the first embodiment in that an auto-zero transistor 346 is provided in place of the auto-zero transistor 344. It is assumed that a pMOS transistor is used as the auto-zero transistor 346.

Figure 15:
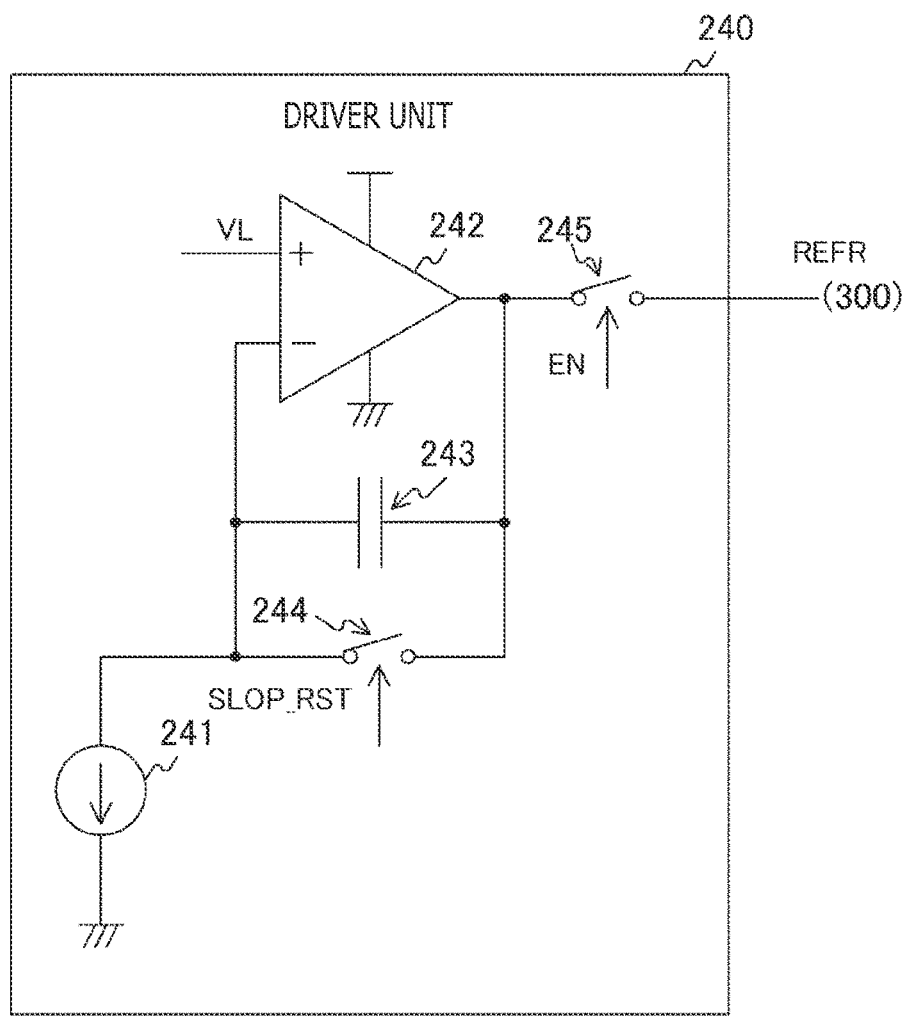
FIG. 15 is a circuit diagram depicting one configuration example of a driver unit according to the second embodiment of the present technology.

FIG. 15 is a circuit diagram depicting one configuration example of the driver unit 240 according to the second embodiment of the present technology. In the driver unit 240 of the second embodiment, a low level VL that is lower than a power source voltage is inputted to the non-inverted input terminal (+) of the operational amplifier 242. In addition, the current source 241 is disposed between the inverted input terminal (−) of the operational amplifier 242 and a grounded node.

Figure 16:
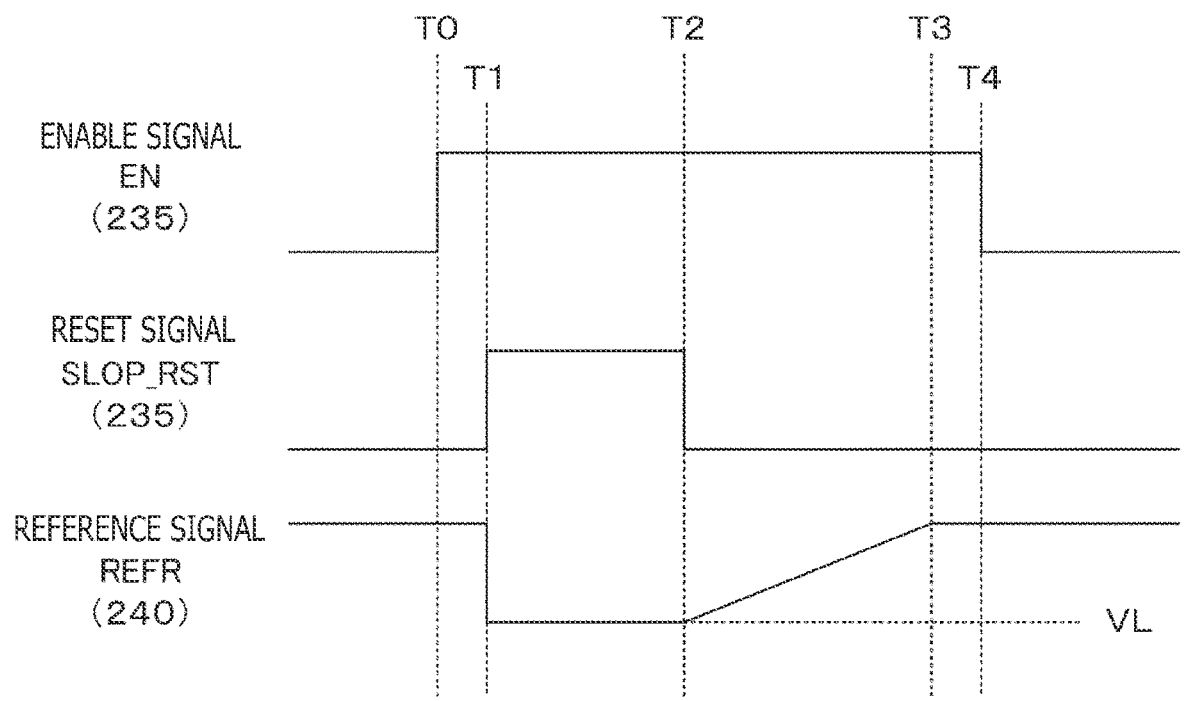
FIG. 16 is a timing chart depicting one example of operation of the driver unit according to the second embodiment of the present technology.

FIG. 16 is a timing chart depicting one example of operation of the driver unit 240 according to the second embodiment of the present technology. The waveforms of an enable signal EN and a reset signal SLOP_RST in the second embodiment are identical to those in the first embodiment.

However, the driver unit 240 supplies a reference signal REFR of low level VL during the time period from timing T1 to T2. Subsequently, during the time period from timing T2 to T3, the driver unit 240 supplies a reference signal REFR the level of which gradually increases with lapse of time.

Figure 17:
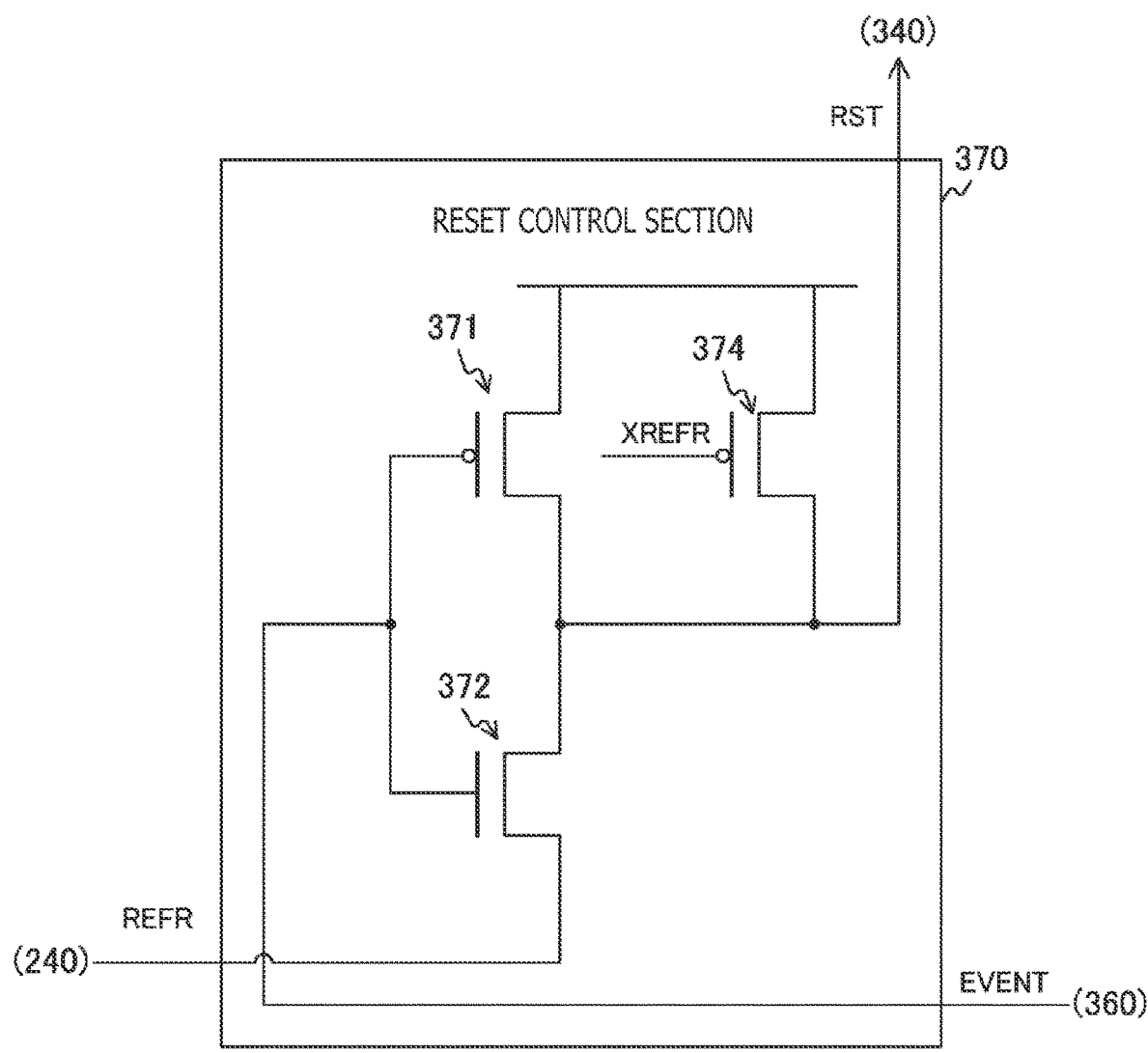
FIG. 17 is a circuit diagram depicting one configuration example of the reset control section according to the second embodiment of the present technology.

FIG. 17 is a circuit diagram depicting one configuration example of the reset control section 370 according to the second embodiment of the present technology. The reset control section 370 according to the second embodiment includes a pMOS transistor 374 in place of the nMOS transistor 373. This is a difference from the first embodiment.

Moreover, in the second embodiment, the pMOS transistor 371 and the nMOS transistor 372 are connected in series between a power source node and the output node of the driver unit 240. Not a detection signal XEVENT but a detection signal EVENT is inputted to the gates of the pMOS transistor 371 and the nMOS transistor 372. The pMOS transistor 374 is disposed between a power source node and a connection node between the pMOS transistor 371 and the nMOS transistor 372.

It is to be noted that a power source for the reset control section 370 does not need to be shared by the differentiation circuit 340.

Figure 18A:
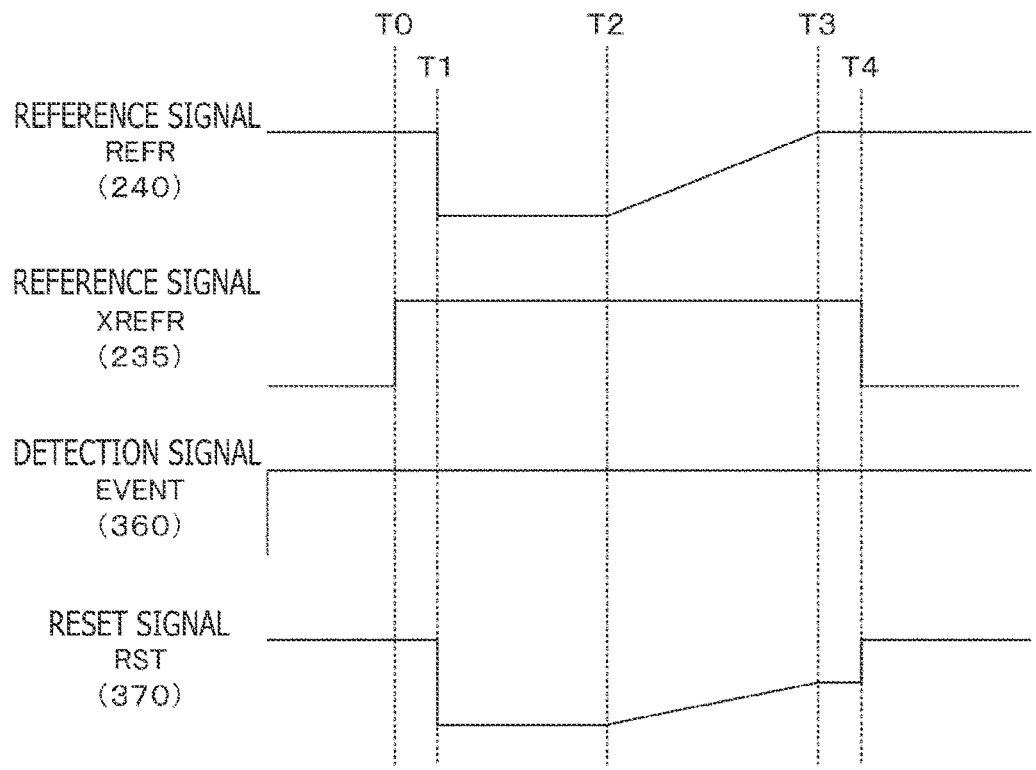
FIGS. 18A and 18B depict timing charts each depicting one example of operation of the reset control section according to the second embodiment of the present technology.
Figure 18B:
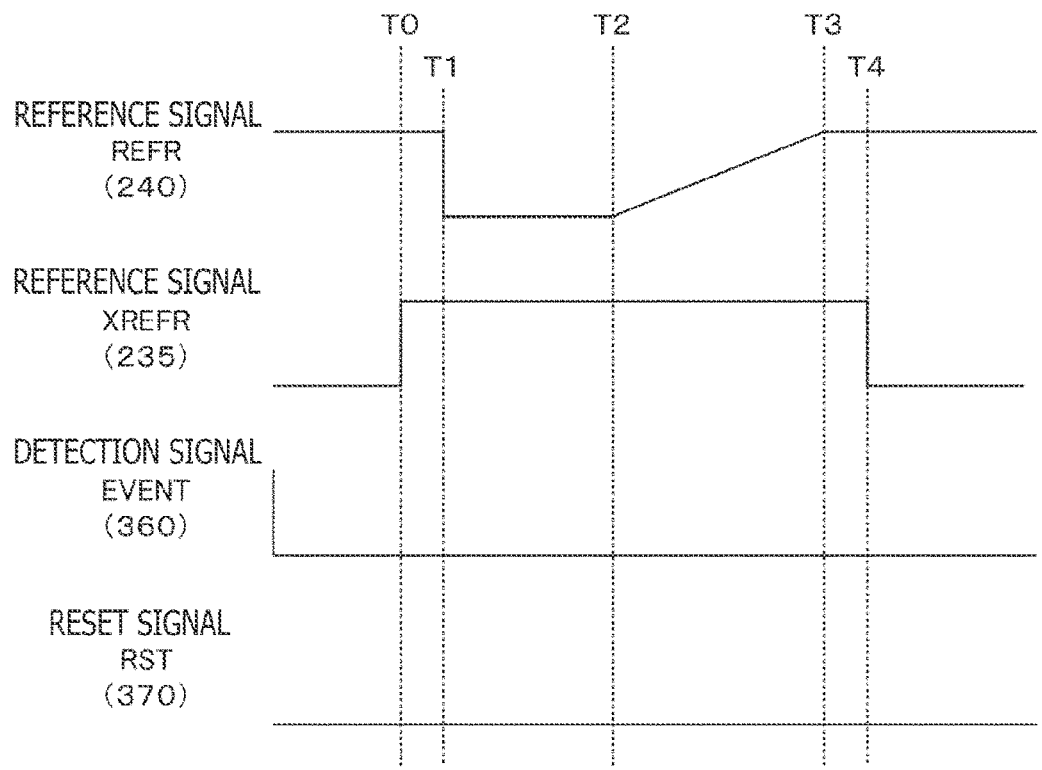

FIGS. 18A and 18B depict timing charts each depicting one example of operation of the reset control section 370 according to the second embodiment of the present technology. In FIGS. 18A and 18B, FIG. 18A is a timing chart depicting one example of operation of the reset control section 370 in a case where an address event has occurred, and FIG. 18B is a timing chart depicting one example of operation of the reset control section 370 in a case where no address event has occurred.

As depicted in FIG. 18A, in a case where an address event has occurred, the output circuit 360 supplies a detection signal EVENT of high level. Further, the system control section 235 keeps a reference signal XREFR at high level during the time period from timing T0 to T4.

During the time period from timing T1 which is immediately after timing T0, to timing T2, the driver unit 240 supplies a reference signal REFR of low level. Subsequently, during the time period from timing T2 to timing T3 which is immediately before timing T4, the driver unit 240 gradually increases the level of the reference signal REFR.

The reset control section 370 supplies a reset signal RST of low level during the time period from timing T1 to T2 and gradually increases the level of the reset signal RST during the time period from timing T2 to T3. By using the reset signal RST, the reset control section 370 can switch the auto-zero transistor 346 which is the P type, from an ON state to an OFF state gradually.

On the other hand, as depicted in FIG. 18B, in a case where no address event has occurred, the output circuit 360 supplies a detection signal XEVENT of low level. The waveforms of reference signals REFR and XREFR in FIG. 18B are identical to those in FIG. 18A. In addition, the reset control section 370 refrains from outputting a reset signal RST.

According to the second embodiment of the present technology, the driving circuit 231 supplies a reference signal REFR the level of which gradually increases, in the above-mentioned manner. Accordingly, with the reference signal, the auto-zero transistor 346 which is the P type can be switched.

3. Third Embodiment

In the above-mentioned first embodiment, the driver units 240 are provided for each row. However, if there is variation in the output properties of the driver units 240, there is a possibility that fixed pattern noise having a stripe shape is generated in image data. In the solid state imaging element 200 according to the third embodiment, a path between the output terminals of the driver units 240 is short-circuited to suppress fixed pattern noise. This is a difference from the first embodiment.

Figure 19:
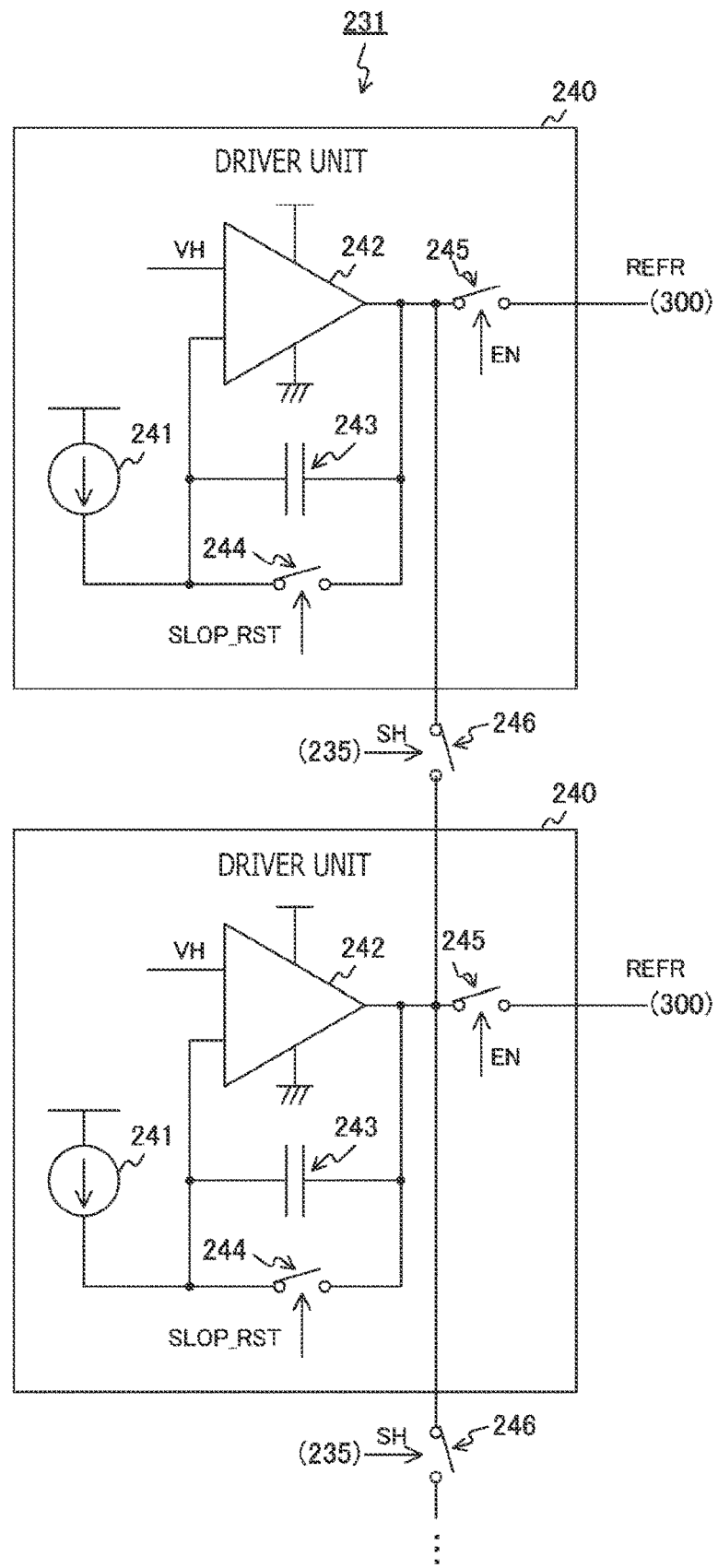
FIG. 19 is a circuit diagram depicting one configuration example of a driving circuit according to a third embodiment of the present technology.

FIG. 19 is a circuit diagram depicting one configuration example of the driving circuit 231 according to the third embodiment of the present technology. The driving circuit 231 of the third embodiment differs from that of the first embodiment in that a plurality of short circuit switches 246 is additionally provided.

When the number of rows is N, N−1 short circuit switches 246 are provided. The n-th (n is an integer of 1 to N) short circuit switch 246 is disposed between the output terminal of the n-th operational amplifier 242 and the output terminal of the n+1 operational amplifier 242.

According to a control signal SH supplied from the system control section 235, the short circuit switch 246 opens/closes the path between the output terminal of the n-th operational amplifier 242 and the output terminal of the n+1-th operational amplifier 242.

In the third embodiment, mode signals including a noise elimination mode for reducing fixed pattern noise and any other mode are inputted to the solid state imaging element 200. In a case where the noise elimination mode is set, the system control section 235 closes each of the short circuit switches 246 according to the control signal SH. As a result, the paths between the output terminals of the operational amplifiers 242 in the each row are short-circuited. Accordingly, variation of outputs from the driver units 240 can be suppressed, and fixed pattern noise which may be caused by the variation can be reduced.

On the other hand, in a case where a mode other than the noise elimination mode is set, the system control section 235 opens each of the short circuit switches 246 according to the control signal SH.

It is to be noted that the second embodiment can be applied to the third embodiment.

According to the third embodiment, the short circuit switches 246 that short-circuit paths between the output terminals of the operational amplifiers 242 are provided, in the above-mentioned manner. Accordingly, variation of outputs from the driver units 240 can be suppressed. Consequently, fixed pattern noise which may be caused by the variation can be reduced.

4. Fourth Embodiment

In the above-mentioned first embodiment, the driver unit 240 supplies a slope-shaped reference signal REFR. However, in some cases, a rectangular signal is required to carry out a test of the solid state imaging element 200. The driver unit 240 according to the fourth embodiment supplies either one a slope-shaped signal and a rectangular signal. This is a difference from the first embodiment.

Figure 20:
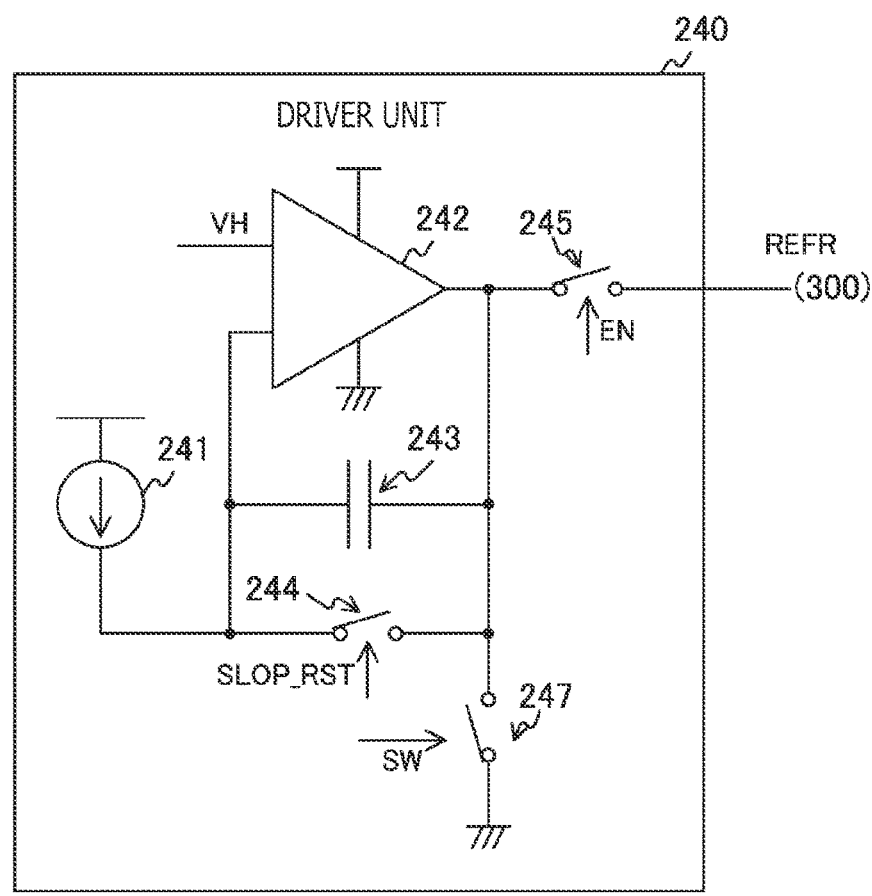
FIG. 20 is a circuit diagram depicting one configuration example of a driver unit according to a fourth embodiment of the present technology.

FIG. 20 is a circuit diagram depicting one configuration example of the driver unit 240 according to the fourth embodiment of the present technology. The driver unit 240 of the fourth embodiment differs from that of the first embodiment in a ground-side switch 247 is additionally provided.

The ground-side switch 247 opens/closes a path between the output terminal of the operational amplifier 242 and a grounded node according to a control signal SW supplied from the system control section 235.

In the fourth embodiment, mode signals including a test mode for carrying out a test and any other mode are inputted to the solid state imaging element 200. When the test mode is set, the system control section 235 alternately opens and closes the short circuit switch 244 and the ground-side switch 247 by using a reset signal SLOP_RST and a control signal SW. As a result, the driver unit 240 can output a rectangular reference signal. On the other hand, in a case where a mode other than the test mode is set, the system control section 235 supplies a reset signal SLOP_RST at a prescribed timing while keeping the ground-side switch 247 closed.

It is to be noted that the second or third embodiment can be applied to the fourth embodiment.

According to the fourth embodiment of the present technology, the ground-side switch 247 is provided to open/close the path between the output terminal of the operational amplifier 242 and the grounded node, in the above-mentioned manner. Accordingly, the system control section 235 can cause the driver unit 240 to generate a rectangular signal to carry out a test.

5. Fifth Embodiment

In the driving circuit 231 according to the above-mentioned first embodiment, the driver units 240 are provided for each row. In this case, the circuit scale of the driving circuit 231 is increased with an increase of the number of rows. In the driving circuit 231 according to the fifth embodiment, one driver unit 240 supplies a reference signal REFR to each of the pixels. This is a difference from the first embodiment.

Figure 21:
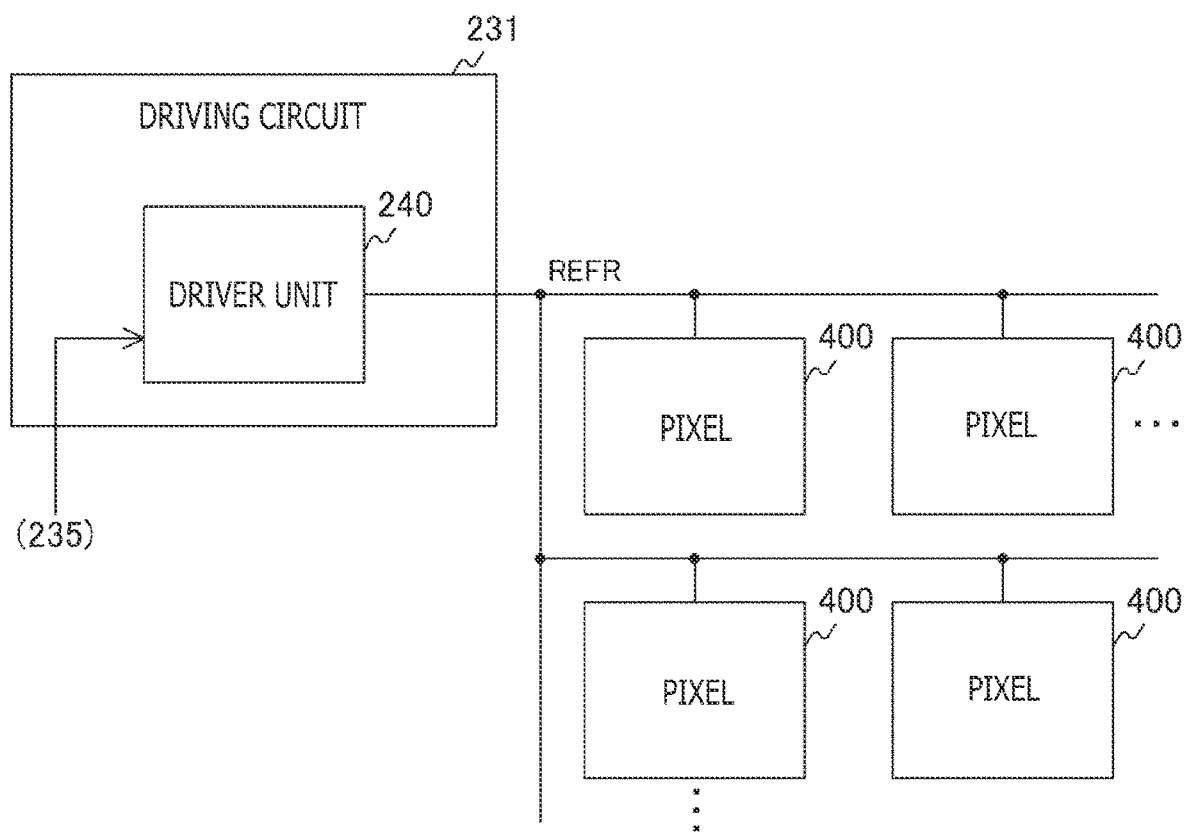
FIG. 21 is a circuit diagram depicting one configuration example of a driving circuit according to a fifth embodiment of the present technology.

FIG. 21 is a circuit diagram depicting one configuration example of the driving circuit 231 according to the fifth embodiment of the present technology. The driving circuit 231 of the fifth embodiment differs from that of the first embodiment in that one driver unit 240 is provided.

The driver unit 240 of the fifth embodiment differs from that of the first embodiment in that driver unit 240 of the fifth embodiment supplies a reference signal REFR to each of the pixels 400 in all the rows. Accordingly, the circuit scale of the driving circuit 231 can be reduced, compared to the case where the driver units 240 are provided for each row.

It is to be noted that the second or fourth embodiment can be applied to the fifth embodiment.

According to the fifth embodiment of the present technology, the driver unit 240 that supplies a reference signal REFR to each of the pixels is provided in the driving circuit 231, in the above-mentioned manner. Accordingly, the circuit scale of the driving circuit 231 can be reduced, compared to the case where the driver units 240 are provided for each row.

6. Examples of Application to Mobile Body

A technology according to the present disclosure (the present technology) is applicable to a variety of products. For example, the technology according to the present disclosure may be implemented as a device to be mounted on a mobile body of any one of types including an automobile, an electric automobile, a hybrid electric automobile, a motorcycle, a bicycle, a personal mobility, an aircraft, a drone, a ship, and a robot.

Figure 22:
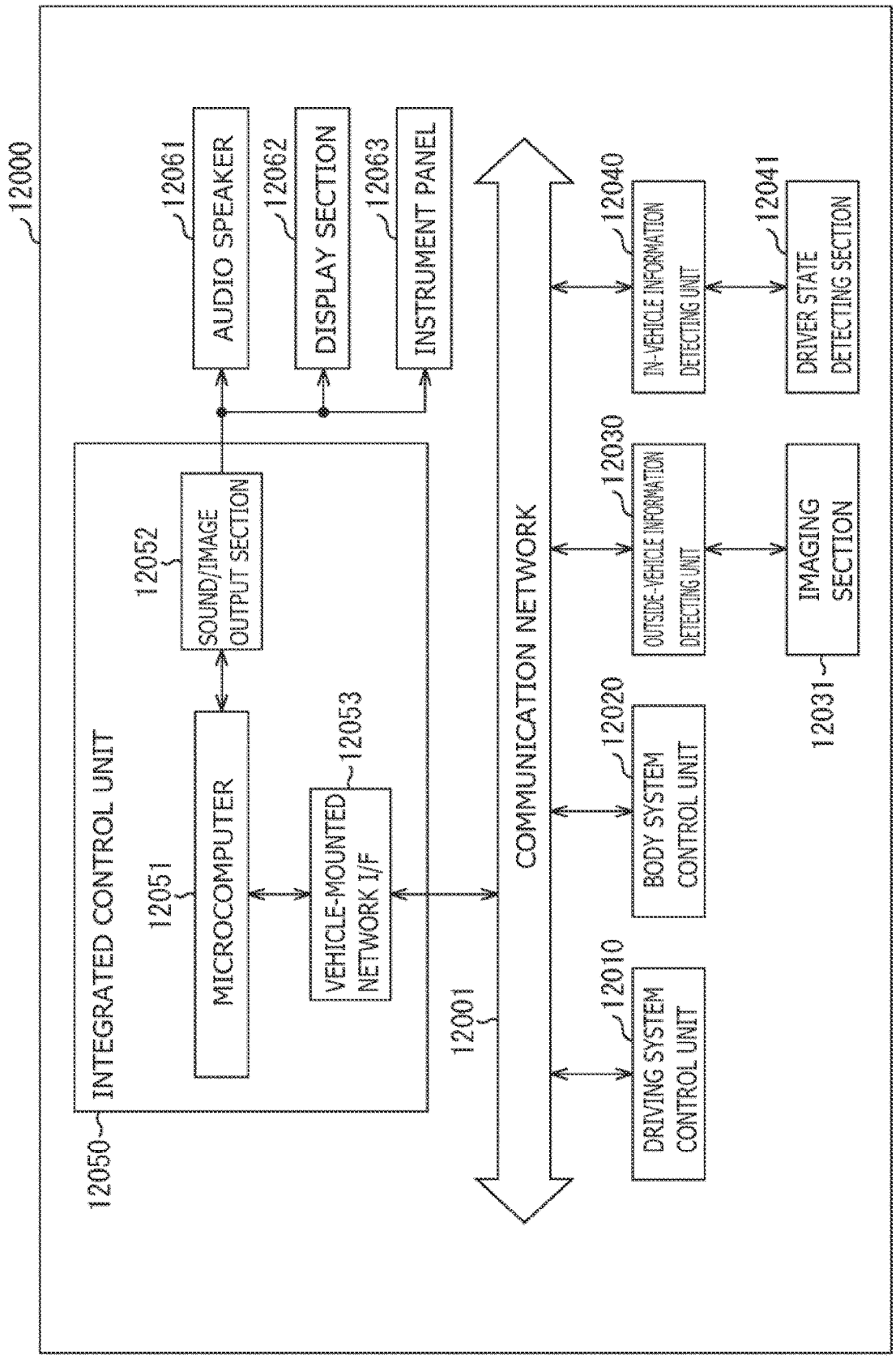
FIG. 22 is a block diagram depicting an example of schematic configuration of a vehicle control system.

FIG. 22 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 22, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 22, an audio speaker 12061, a display section 12062, and an instrument panel 12063 are illustrated as the output device. The display section 12062 may, for example, include at least one of an on-board display and a head-up display.

Figure 23:
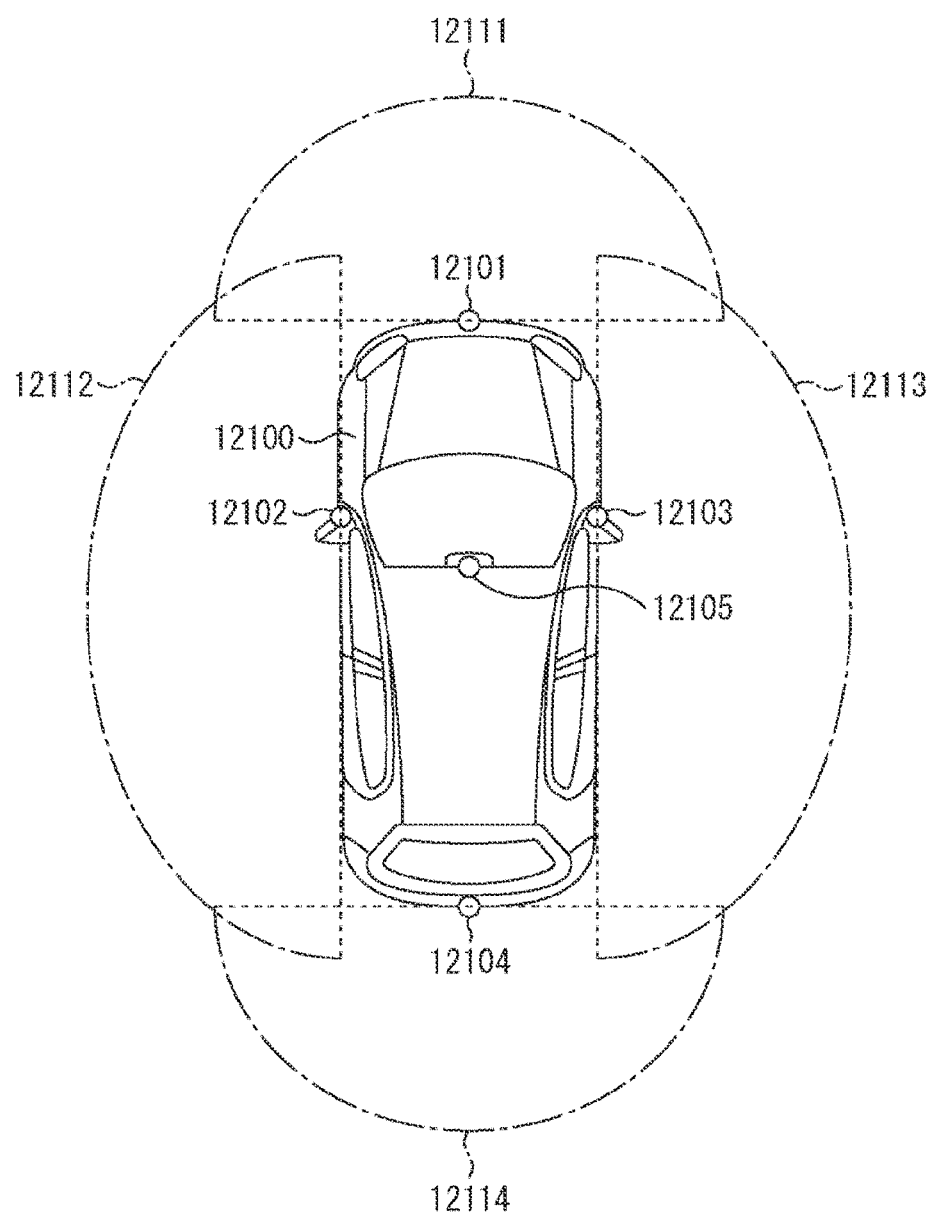
FIG. 23 is a diagram of assistance in explaining an example of installation positions of an outside-vehicle information detecting section and an imaging section.

FIG. 23 is a diagram depicting an example of the installation position of the imaging section 12031.

In FIG. 23, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 23 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure can be applied has been explained so far. The technology according to the present disclosure can be applied to the imaging section 12031 in the above-mentioned configuration. Specifically, the imaging device 100 in FIG. 1 can be applied to the imaging section 12031. When the technology according to the present disclosure is applied to the imaging section 12031, the circuit area in each pixel can be reduced, whereby microfabrication of the pixels is achieved. Consequently, a photograph image having higher resolution can be obtained.

It is to be noted that the above-mentioned embodiments each exemplify one example for carrying out the present technology, and the features of the embodiments have a correspondence with the invention-specifying features of the claims. Similarly, the invention-specifying features of the claims have the correspondence relationship with components having the same names in the embodiments. However, the present technology is not limited to the embodiments, and can be embodied by various modifications of the embodiments within the scope of the gist of the present technology.

It is to be noted that the effects described in the present description are just examples, and thus, are not limited. In addition, any other effect may be provided.

It is to be noted that the present technology may have the following configurations.

(1)

A solid state imaging element including:

a driving circuit that supplies a prescribed reference signal a level of which gradually fluctuates with lapse of time; and a plurality of pixels each including an auto-zero transistor that initializes a change amount acquisition section for obtaining a brightness change amount, and a reset control section that, in a case where a prescribed address event has occurred, switches the auto-zero transistor by using the reference signal.

(2)

The solid state imaging element according to (1), in which a polarity of the auto-zero transistor is an N type, the level of the reference signal gradually decreases with lapse of time, the reset control section includes an inversion circuit that inverts a detection signal indicating a detection result of the address event and outputs the inverted signal to a gate of the auto-zero switch, and an N-type transistor that is disposed between an output node and a grounded node of the inversion circuit, and the inversion circuit is disposed between an output node and a grounded node of the driving circuit.

(3)

The solid state imaging element according to (1), in which a polarity of the auto-zero transistor is a P type, the level of the reference signal gradually increases with lapse of time, the reset control section includes an inversion circuit that inverts a detection signal indicating a detection result of the address event and outputs the inverted signal to a gate of the auto-zero switch, and a P-type transistor that is disposed between an output node and a grounded node of the inversion circuit, and the inversion circuit is disposed between an output node and a power source node of the driving circuit.

(4)

The solid state imaging element according to any one of (1) to (3), in which
the driving circuit includes a plurality of driver units that is connected to different rows, and
pixels are arranged in a prescribed direction in each of the rows.

(5)

The solid state imaging element according to (4), in which
the plurality of driver units includes operational amplifiers, and
the solid state imaging element further includes a short circuit switch that short-circuits a path between each output node of the operational amplifiers.

(6)

The solid state imaging element according to any one of (1) to (5), in which
the driving circuit includes a driver unit that generates the reference signal, and
the driver unit includes
an operational amplifier,
a current source that is connected to an input terminal of the operational amplifier,
a capacity that is disposed between the input terminal and an output terminal of the operational amplifier, and
a short circuit switch that opens/closes a path between the input terminal and the output terminal.

(7)

The solid state imaging element according to (6), in which
the driver unit further includes a ground-side switch that opens/closes a path between the output terminal and a prescribed grounded node.

(8)

The solid state imaging element according to (1), in which
the driving circuit includes a driver unit that supplies the reference signal to each of the plurality of pixels.

(9)

The solid state imaging element according to any one of (1) to (8), in which
each of the pixels includes
a logarithm response section that obtains a logarithm value of a photoelectric current,
a differentiation circuit that differentiates the logarithm value, and outputs the differentiated value as a differentiated signal,
a comparison circuit that compares the differentiated signal with a prescribed threshold, and
the reset control section, and
the change amount acquisition section and the auto-zero transistor are disposed on the differentiation circuit.

(10)

An imaging device including:
a driving circuit that supplies a prescribed reference signal a level of which gradually fluctuates with lapse of time;
a plurality of pixels each including an auto-zero transistor that initializes a change amount acquisition section for obtaining a brightness change amount, and a reset control section that, in a case where a prescribed address event has occurred, switches the auto-zero transistor by using the reference signal; and
a signal processing section that processes a detection signal indicating whether or not the address event has occurred.

REFERENCE SIGNS LIST

100: Imaging device
110: Imaging lens
120: Recoding section
130: Control section
200: Solid state imaging element
201: Light reception chip
202: Circuit chip
210: Light reception section
211: Light reception-side circuit
221: Photoelectric conversion element
231: Driving circuit
232: Signal processing section
233: Y arbiter
234: X arbiter
235: System control section
240: Driver unit
241: Current source
242, 342: Operational amplifier
243, 341, 343: Capacity
244, 246: Short circuit switch
245: Enable switch
247: Ground-side switch
300: Circuit arrangement section
310: DVS circuit
320: Logarithm response section
321, 322, 352, 354, 372, 373: nMOS transistor
323, 331, 332, 351, 353, 371, 374: pMOS transistor
330: Buffer
340: Differentiation circuit
344, 346: Auto-zero transistor
345: Change amount acquisition section
350: Comparison circuit
360: Output circuit
370: Reset control section
400: Pixel
12031: Imaging section

The invention claimed is:

1. A solid state imaging element, comprising:
a driving circuit configured to supply a specific reference signal, wherein a level of the specific reference signal gradually fluctuates with lapse of time; and
a plurality of pixels, wherein each of the plurality of pixels includes:
a change amount acquisition section;
an auto-zero transistor configured to initialize the change amount acquisition section to obtain a brightness change amount;
a logarithm response section configured to obtain a logarithm value of a photoelectric current;
a differentiation circuit configured to differentiate the logarithm value and output the differentiated logarithm value as a differentiated signal;
a comparison circuit configured to compare the differentiated signal with a specific threshold; and
a reset control section configured to switch, based on occurrence of a specific address event, the auto-zero transistor by use of the specific reference signal.

2. The solid state imaging element according to claim 1, wherein
a polarity of the auto-zero transistor is an N type,
the level of the specific reference signal gradually decreases with the lapse of time,
the reset control section includes:
an inversion circuit configured to invert a detection signal and output the inverted detection signal to a gate of the auto-zero transistor, wherein the detection signal indicates a detection result of the specific address event; and an N-type transistor between an output node of the inversion circuit and a grounded node of the inversion circuit, wherein the inversion circuit is between an output node of the driving circuit and a grounded node of the driving circuit.

3. The solid state imaging element according to claim 1, wherein
a polarity of the auto-zero transistor is a P type,
the level of the specific reference signal gradually increases with the lapse of time,
the reset control section includes;
an inversion circuit configured to invert a detection signal and output the inverted detection signal to a gate of the auto-zero transistor, wherein the detection signal indicates a detection result of the specific address event; and
a P-type transistor between an output node of the inversion circuit and a grounded node of the inversion circuit, wherein the inversion circuit is between an output node of the driving circuit and a power source node of the driving circuit.

4. The solid state imaging element according to claim 1, wherein
the driving circuit includes a plurality of driver units connected to different rows, and
the plurality of pixels are in a specific direction in each of the different rows.

5. The solid state imaging element according to claim 4, wherein
the plurality of driver units includes operational amplifiers, and
the solid state imaging element further includes a short circuit switch configured to short-circuit a path between each output node of the operational amplifiers.

6. The solid state imaging element according to claim 1, wherein
the driving circuit includes a driver unit configured to generate the specific reference signal, and
the driver unit includes:
an operational amplifier;
a current source that is connected to an input terminal of the operational amplifier;
a capacity between the input terminal and an output terminal of the operational amplifier, and
a short circuit switch configured to open or close a first path between the input terminal and the output terminal.

7. The solid state imaging element according to claim 6, wherein the driver unit further includes a ground-side switch configured to open or close a second path between the output terminal and a specific grounded node.

8. The solid state imaging element according to claim 1, wherein the driving circuit includes a driver unit configured to supply the specific reference signal to each of the plurality of pixels.

9. The solid state imaging element according to claim 1, wherein
the change amount acquisition section and the auto-zero transistor are on the differentiation circuit.

10. An imaging device, comprising:
a driving circuit configured to supply a specific reference signal, wherein a level of the specific reference signal gradually fluctuates with lapse of time;
a plurality of pixels, wherein each of the plurality of pixels includes:
a change amount acquisition section;
an auto-zero transistor configured to initialize the change amount acquisition section to obtain a brightness change amount;
a logarithm response section configured to obtain a logarithm value of a photoelectric current;
a differentiation circuit configured to differentiate the logarithm value, and output the differentiated logarithm value as a differentiated signal;
a comparison circuit configured to compare the differentiated signal with a specific threshold; and
a reset control section configured to switch, based on occurrence of a specific address event, the auto-zero transistor by use of the specific reference signal; and
a signal processing section configured to process a detection signal that indicates the occurrence of the specific address event.

* * * * *